(12) United States Patent
Tasaka et al.

(10) Patent No.: US 8,865,312 B2
(45) Date of Patent: Oct. 21, 2014

(54) COATING COMPOSITION FOR SOLAR CELL BACKSHEET AND SOLAR CELL BACKSHEET

(75) Inventors: Michihisa Tasaka, Tokyo (JP); Hiroyasu Kanno, Tokyo (JP)

(73) Assignees: Riken Technos Corp., Tokyo (JP); BASF SE, Ludwigshafen (DE)

( * ) Notice: Subject to any disclaimer, the term of this patent is extended or adjusted under 35 U.S.C. 154(b) by 0 days.

(21) Appl. No.: 13/805,493

(22) PCT Filed: Jun. 25, 2010

(86) PCT No.: PCT/JP2010/060884
§ 371 (c)(1),
(2), (4) Date: Dec. 19, 2012

(87) PCT Pub. No.: WO2011/161826
PCT Pub. Date: Dec. 29, 2011

(65) Prior Publication Data
US 2013/0095326 A1    Apr. 18, 2013

(51) Int. Cl.
| | | |
|---|---|---|
| *C09D 133/08* | (2006.01) | |
| *B32B 27/30* | (2006.01) | |
| *B32B 27/36* | (2006.01) | |
| *C08F 263/02* | (2006.01) | |
| *C08F 283/01* | (2006.01) | |
| *C08F 283/00* | (2006.01) | |
| *C09D 4/06* | (2006.01) | |
| *H01L 31/048* | (2014.01) | |
| *C08K 5/10* | (2006.01) | |
| *C08K 5/00* | (2006.01) | |

(52) U.S. Cl.
CPC ............ *C09D 133/08* (2013.01); *C08F 283/01* (2013.01); *C08K 5/10* (2013.01); *C08F 283/008* (2013.01); *C08K 5/0025* (2013.01); *C09D 4/06* (2013.01); *H01L 31/048* (2013.01); *Y02E 10/52* (2013.01); *C08K 5/005* (2013.01)
USPC ........... 428/413; 428/483; 523/437; 523/438; 524/310; 524/507; 524/516; 524/523; 524/524; 136/256

(58) Field of Classification Search
CPC ... H01L 31/048; C09D 133/08; C08F 283/01; C08F 263/02
USPC ............ 522/96, 107, 114, 116; 523/437, 438; 524/507, 516, 523, 524, 310; 136/256; 428/413, 483
See application file for complete search history.

(56) References Cited

U.S. PATENT DOCUMENTS

| | | |
|---|---|---|
| 2008/0261037 A1 | 10/2008 | Snow |
| 2009/0145478 A1 | 6/2009 | Takahashi |
| 2010/0221552 A1* | 9/2010 | Ishida et al. ............... 428/423.1 |
| 2011/0214717 A1* | 9/2011 | Halahmi et al. ............. 136/251 |

FOREIGN PATENT DOCUMENTS

| | | |
|---|---|---|
| JP | 05-051542 | 3/1993 |
| JP | 2006-332091 | 12/2006 |
| JP | 2007-129204 | 5/2007 |
| JP | 2009-158951 | 7/2009 |
| JP | 2009-260274 | 11/2009 |

OTHER PUBLICATIONS

Machine translation of JP 2006-332091A; pub. date: Dec. 2006.*
Machine translation of JP 2007-129204A; pub. date: May 2007.*
International Search Report for International Application No. PCT/JP2010/060884 mailed on Aug. 17, 2010.

* cited by examiner

*Primary Examiner* — Fred M Teskin
(74) *Attorney, Agent, or Firm* — Amin, Turocy & Watson, LLP

(57) ABSTRACT

A coating composition for a solar cell backsheet of the present invention includes: (a) 10 to 40 mass % of vinyl ester resin or unsaturated polyester resin; (b) 30 to 60 mass % of vinyl monomer and/or (meth)acrylate monomer; (c) 5 to 40 mass % of denaturant (The components (a) to (c) are 100 mass % in total); (d) 0.1 to 15 parts by mass of an ultraviolet curing agent relative to 100 parts by mass in total of the components (a) to (c); and (e) 5 to 20 parts by mass of a white colorant relative to 100 parts by mass in total of the components (a) to (c).

20 Claims, No Drawings

COATING COMPOSITION FOR SOLAR CELL BACKSHEET AND SOLAR CELL BACKSHEET

TECHNICAL FIELD

The present invention relates to a coating composition for a solar cell backsheet and a solar cell backsheet, and particularly to a coating composition for a solar cell backsheet and a solar cell backsheet that are excellent in adhesiveness to a copolymer of ethylene and vinyl acetate and polyester-based resin and are excellent in water-vapor barrier properties, weather resistance, and flame resistance.

BACKGROUND ART

In recent years, the depletion of fossil energy sources such as oil and coal has been a problem. Another major problem is destruction of environment such as global warming that is attributable to an increase in emissions of $CO_2$, which is generated as the fossil fuels are burned. In such a situation, solar power generation has been put to practical use as an alternative source of clean energy that utilizes unlimited amounts of solar radiation energy. Solar cells are an essential part of a solar power generation system that converts solar energy directly into electricity, and are made from photovoltaic devices such as crystalline silicon, polycrystalline silicon, amorphous silicon, copper indium selenide, and compound semiconductors. As for a structure thereof, a single photovoltaic device is not used without being changed. In general, several, or dozens of, photovoltaic devices are wired together in series or parallel. Moreover, packaging is carried out in various ways to protect the devices for a long period of time. In this manner, the devices are turned into units as solar cell modules.

The solar cell modules include the following basic functions: sending solar radiation energy to the photovoltaic devices in an efficient manner, and protecting the photovoltaic devices and internal wiring from harsh natural environment for a long period of time. In a solar cell module, in general, the following are stacked in the order described below: an upper transparent material, which includes a glass of a plane which sunlight hits, transparent plastics, and the like; an sealing-material layer, which includes thermoplastic resin such as copolymer of ethylene and vinyl acetate (referred to as EVA, hereinafter); a plurality of solar cells, which function as photovoltaic devices; a sealing-material layer, which is similar to the above sealing-material layer; and a solar cell backsheet. The above components are formed integrally by vacuum heating lamination method or the like.

The solar cell backsheet is required to be excellent in mechanical strength to protect internal components such as solar cells and leads, as well as to be excellent in various characteristics such as weather resistance, heat resistance, water resistance, light resistance, and chemical resistance. In particular, the solar cell backsheet is required to have a high level of gas barrier property in order to prevent ingress of moisture, oxygen, and the like. What is important to keep the barrier property is a material having barrier property, as well as adhesion and adhesiveness stability with the sealing-material layer such as EVA. The reason is that separation and discoloration of the sealing-material layer and corrosion of the wiring could occur due to transmission of moisture from an interface, possibly having an impact on the output of the modules. Furthermore, in order to contribute to improving power generation efficiency, an inner surface is required to be white.

Conventionally, for the solar cell backsheet, fluororesin has been used: the fluororesin is good in weather resistance and flame resistance, as well as good in adhesiveness to EVA that is frequently used as filler, such as polyvinyl fluoride (PVF) or polyvinylidene fluoride (PVDF). However, the use of a single sheet of fluororesin comes with problems in water-vapor barrier properties, transparency, weather resistance, flame resistance, and the like.

To solve the above problems, the use of polyester-based film as a solar cell backsheet is frequently proposed. For example, what is disclosed in Patent Document 1 is a backside sealing film for solar cell, which includes a laminated body of polybutylene terephthalate (PBT) film containing titanium oxide produced by chlorine method. However, while showing an improvement in hydrolyzability compared with PET and balanced physical properties, the backside sealing film has the problem that the backside sealing film is poor in adhesiveness to the sealing-material layer such as EVA. As described above, the use of conventional techniques cannot lead to a solar cell backsheet that is good in adhesiveness to the sealing-material layer made of EVA, and excellent in water-vapor barrier properties, transparency, weather resistance, and flame resistance.

PRIOR ART DOCUMENT

Patent Document

Patent Document 1: Jpn. Pat. Appln. Laid-Open Publication No. 2007-129204

DISCLOSURE OF THE INVENTION

Problems to be Solved by the Invention

The present invention has been made in view of the above problems. The object of the present invention is to provide a coating composition for a solar cell backsheet and a solar cell backsheet which are such excellent in adhesiveness to EVA, which is a sealing material of solar cells, and to polyester-based resin that direct coating is possible, and which are excellent in various characteristics such as water-vapor barrier properties, weather resistance, flame resistance, light reflectivity, and light diffusion properties, and which are excellent in design characteristics at low cost and have a high protection ability.

Means for Solving the Problems

As a result of extensive studies, the present inventor has completed the present invention after finding that a composition containing the following components (a), (b), (c), (d), and (e) with a specific quantitative relationship therebetween can solve the above problems.

That is, the present invention is as follows:

1. A coating composition for a solar cell backsheet, including:
    (a) 10 to 40 mass % of vinyl ester resin or unsaturated polyester resin;
    (b) 30 to 70 mass % of vinyl monomer and/or (meth)acrylate monomer;
    (c) 5 to 40 mass % of denaturant (The components (a) to (c) are 100 mass % in total);
    (d) 0.1 to 15 parts by mass of an ultraviolet curing agent relative to 100 parts by mass in total of the components (a) to (c); and
    (e) 5 to 20 parts by mass of a white colorant relative to 100 parts by mass in total of the components (a) to (c)

2. The coating composition for a solar cell backsheet according to the above section 1, characterized in that
the component (a) is epoxy(meth)acrylate.
3. The coating composition for a solar cell backsheet according to the above section 1 or 2, characterized in that
the component (b) is a monomer having an N-vinyl group.
4. The coating composition for a solar cell backsheet according to one of the above sections 1 to 3, characterized in that
the component (c) is at least one selected from among a group consisting of: polyol (c-1) with a hydroxyl value of 40 to 330 mgKOH/g; polyol (c-2) with a hydroxyl value of 40 to 330 mgKOH/g and with an acid value of 2 to 20 mgKOH/g; modified rubber (c-3); and compound (c-4) with an epoxy equivalent of 150 to 700 g/mol.
5. The coating composition for a solar cell backsheet according to the above section 4, characterized in that
the component (c-1) is at least one selected from among a group consisting of: castor oil-based polyol (c-1-1) with a hydroxyl value of 40 to 330 mgKOH/g; polybutadiene-based polyol (c-1-2) with a hydroxyl value of 40 to 330 mgKOH/g; and polyisoprene-based polyol, or a hydrogen additive thereof, (c-1-3) with a hydroxyl value of 40 to 330 mgKOH/g.
6. The coating composition for a solar cell backsheet according to the above section 5, characterized in that
the component (c-1) is an aromatic castor oil-based polyol (c-1-1-1) with a hydroxyl value of 40 to 330 mgKOH/g.
7. The coating composition for a solar cell backsheet according to the above section 4, characterized in that
the component (c-2) is a castor oil-based polyol (c-2-1) with a hydroxyl value of 40 to 330 mgKOH/g and with an acid value of 2 to 20 mgKOH/g.
8. The coating composition for a solar cell backsheet according to the above section 4, characterized in that
the component (c-3) is acid-modified polybutadiene or acid-modified polyisoprene.
9. The coating composition for a solar cell backsheet according to the above section 4, characterized in that
the component (c-4) is a polyepoxy compound (c-4-1) with an epoxy equivalent of 150 to 250 g/mol.
10. The coating composition for a solar cell backsheet according to the above section 4, characterized in that
the component (c-4) is a polymer (c-4-2) with an epoxy equivalent of 500 to 700 g/mol that includes a saturated skeleton.
11. The coating composition for a solar cell backsheet according to one of the above sections 1 to 10, characterized in that
an adherend is at least one selected from among copolymers of ethylene and vinyl acetate and polyester-based resins.
12. A solar cell backsheet, including:
a layer (A) of the coating composition for a solar cell backsheet claimed in one of the above sections 1 to 11; and
a layer (B) made from polyester-based resin.

Advantages of the Invention

The solar cell-backsheet coating composition of the present invention contains the above components (a), (b), (c), (d), and (e) with a specific quantitative relationship therebetween. Therefore, it is possible to provide a solar cell backsheet which is such excellent in adhesiveness to EVA, which is a sealing material of solar cells, and the like that direct coating is possible, and which is excellent in various characteristics such as water-vapor barrier properties, weather resistance, flame resistance, light reflectivity, and light diffusion properties, and which is excellent in design characteristics at low cost and has a high protection ability.

Moreover, the solar cell backsheet of the present invention contains a layer (A) of the solar cell-backsheet coating composition and a layer (B) of polyester-based resin. Therefore, the solar cell backsheet is excellent in adhesiveness to EVA, which is a sealing material of solar cells, and the like. The solar cell backsheet is also excellent in adhesiveness between the layers (A) and (B). Furthermore, the solar cell backsheet is excellent in various characteristics such as water-vapor barrier properties, weather resistance, flame resistance, light reflectivity, and light diffusion properties, and is excellent in design characteristics at low cost and has a high protection ability.

BEST MODE FOR CARRYING OUT THE INVENTION

Hereinafter, the present invention will be described in more detail.
(a) Vinyl Ester Resin or Unsaturated Polyester Resin A component (a) of a coating composition of the present invention is vinyl ester resin or unsaturated polyester resin.

More specifically, the vinyl ester resin is selected from among the following: urethane(meth)acrylate resin, epoxy (meth)acrylate resin, and polyester(meth)acrylate resin. Epoxy(meth)acrylate resin is more preferred since the epoxy (meth)acrylate resin is excellent in weather resistance and in adhesiveness (which may be referred to as adhesiveness to adherend, or simply as adhesiveness) to EVA or the like, which is a sealing material of solar cells, and to polyester-based resin. Incidentally, according to the present invention, (meth)acrylate means acrylate or methacrylate.

It is preferred that the above urethane(meth)acrylate resin be a resin obtained by reaction of (meth)acrylate that contains polyol, polyisocyanate and one or more hydroxyl groups per molecule, with the resin including two or more (meth)acryloyl groups in one molecule.

The polyol that is used in the above urethane(meth)acrylate has preferably a number average molecular weight of 200 to 3,000, or more preferably a number average molecular weight of 400 to 2,000.

The polyols include polyether polyol, polyester polyol, polycarbonate polyol, and polybutadiene polyol, among other things. The above substances may be used independently, or two or more of the substances may be used in combination.

In this case, polyether polyols include: polyalkylene oxides, such as polyethylene glycol, polypropylene glycol, and polytetramethylene glycol; and polyols made by adding the above alkylene oxides to bisphenol A and bisphenol F.

Polyester polyol is a condensation polymer of dibasic acids and polyhydric alcohols, or a ring-opened polymer of cyclic ester compound such as polycaprolactone. The dibasic acids used here, for example, include phthalic acid, phthalic anhydride, halogenated phthalic anhydride, isophthalic acid, terephthalic acid, tetrahydrophthalic acid, tetrahydro phthalic anhydride, hexahydrophthalic acid, hexahydro phthalic anhydride, hexahydroterephthalic acid, hexahydroisophthalic acid, succinic acid, malonic acid, glutaric acid, adipic acid, sebacic acid, 1,12-dodecane dicarboxylic acid, 2,6-naphthalene dicarboxylic acid, 2,7-naphthalene dicarboxylic acid, 2,3-naphthalene dicarboxylic acid, 2,3-naphthalene dicarboxylic acid anhydride, 4,4'-biphenyl dicarboxylic acid, or dialkyl esters of the above substances. For example, polyhydric alcohols include ethylene glycol, diethylene glycol, triethylene glycol, polyethylene glycol, propylene glycol, dipropylene glycol, tripropylene glycol, polypropylene glycol, 2-methyl-1,3-propanediol, 1,3-butanediol, neopentyl glycol, hydrogenated bisphenol A, 1,4-butanediol, 1,6-hexanediol, adduct of bisphenol A and propylene oxide or ethylene oxide, 1,2,3,4-tetrahydroxy butane, glycerin, trimethylol propan, 1,3-propanediol, 1,2-cyclohexane glycol, 1,3-cyclohexane glycol, 1,4-cyclohexane glycol, 1,4-cyclohexanedimethanol, paraxylene glycol, bicyclohexyl-4,4'-diol, 2,6-decalin glycol, 2,7-decalin glycol, and the like.

Polyisocyanates that are used in the above urethane(meth)acrylate resin includes: 2,4-TDI, and an isomer thereof or a mixture of isomers; MDI; HDI; IPDI; XDI; hydrogenation XDI; dicyclohexyl methane diisocyanate; tolidine diisocyanate; naphthalene diisocyanate; and triphenylmethane triisocyanate. The above substances may be used independently, or two or more of the substances may be used in combination.

For example, (meth)acrylate (or hydroxyl group-containing (meth)acrylate) that contains one or more hydroxyl groups per molecule and is used in the above urethane(meth)acrylate resin includes: mono(meth)acrylates, such as 2-hydroxyethyl(meth)acrylate, 2-hydroxypropyl(meth)acrylate, 3-hydroxybutyl(meth)acrylate, polyethylene glycol mono(meth)acrylate, and polypropylene glycol mono(meth)acrylate; polyvalent(meth)acrylates, such as tris(hydroxyethyl) isocyanuric acid di(meth)acrylate, and pentaerythritol tri(meth)acrylate.

The following methods are examples of a production method of the above urethane(meth)acrylate resin: (1) a method of first making polyisocyanate and polyol react preferably with NCO/OH=1.3 to 2 to generate a terminal isocyanate compound, and then making the terminal isocyanate compound react with hydroxyl group-containing (meth)acrylate in such a way that hydroxyl groups are substantially equal in amount to isocyanate groups; and (2) a method of making a polyisocyanate compound and hydroxyl group-containing (meth)acrylate react with NCO/OH equal to or greater than 2 to generate a compound of single-terminal isocyanate, and then adding polyol before reaction.

Epoxy(meth)acrylate resin that is used as vinyl ester resin preferably includes two or more (meth)acryloyl groups in one molecule, and is obtained by reaction of epoxy resin and unsaturated monobasic acid in the presence of an esterification catalyst.

The following are examples of epoxy resin: only epoxy resin of a bisphenol or novolac type; or a resin obtained by mixture of epoxy resins of bisphenol and novolac types. It is preferred that the average epoxy equivalent thereof be within the range of 150 to 450.

Epoxy resins of the above bisphenol type include the following, among other things: epoxy resin of a glycidyl ether type, which is obtained by reaction of epichlorohydrin and bisphenol A or bisphenol F and substantially includes two or more epoxy groups in one molecule; epoxy resin of a methyl glycidyl ether type, which is obtained by reaction of methyl epichlorohydrin and bisphenol A or bisphenol F; and epoxy resin obtained from an alkylene oxide adduct of bisphenol A and epichlorohydrin or methyl epichlorohydrin. Epoxy resins of the above novolac type include the following, among other things: epoxy resin obtained by reaction of phenolic novolac or cresol novolac, and epichlorohydrin or methyl epichlorohydrin.

For example, unsaturated monobasic acids that are used in the epoxy(meth)acrylate resin include the following, among other things: acrylic acid, methacrylic acid, cinnamic acid, crotonic acid, monomethyl maleate, monopropyl maleate, maleic acid mono(2-ethylhexyl), and sorbic acid. Incidentally, the above unsaturated monobasic acids may be used independently, or two or more of the unsaturated monobasic acids may be used in combination. The above reaction of epoxy resin and unsaturated monobasic acid takes place with the use of an esterification catalyst preferably at 60 to 140 degrees Celsius, or particularly preferably at 80 to 120 degrees Celsius.

Examples of the esterification catalyst, publicly-known catalysts, including the following, can be used without being changed: tertiary amine, such as triethylamine, N,N-dimethylbenzylamine, N,N-dimethylaniline, or diazabicyclooctane; and triphenylphosphine or diethylamine hydrochloride.

Polyester (meth)acrylate resin that is used as vinyl ester resin is saturated or unsaturated polyester which includes two or more (meth)acryloyl groups in one molecule, and which is obtained by making a (meth)acrylic compound react with an end of saturated or unsaturated polyester. It is preferred that the number average molecular weight of the resin be 500 to 5,000.

Saturated polyester that is used in the present invention is obtained by condensation reaction of saturated dibasic acids and polyhydric alcohols. Unsaturated polyester is obtained by condensation reaction of dibasic acids, including α,β-unsaturated dibasic acids, and polyhydric alcohols. Incidentally, the resin that is obtained by making a (meth)acrylic compound react with an end of unsaturated polyester is regarded as vinyl ester resin in the case of the present invention, and is distinguished from unsaturated polyester resin, which will be described later.

Saturated dibasic acids include compounds that are shown in the above section of polyester polyol. α,β-unsaturated dibasic acids include maleic acid, maleic anhydride, fumaric acid, itaconic acid, and itaconic acid anhydride. Polyhydric alcohols include compounds that are shown in the above section of polyester polyol.

For the (meth)acrylic compound of polyester(meth)acrylate resin that is used as vinyl ester resin, the following may be used: various unsaturated monobasic acids, such as unsaturated glycidyl compounds, acrylic acids, or methacrylic acids; and glycidyl esters thereof. The use of glycidyl(meth)acrylate is desirable.

Unsaturated polyester resin is obtained by polycondensation of acid and alcohol components in accordance with a publicly-known method. The type of unsaturated polyester resin is not specifically limited as long as the resin is known as thermosetting resin. Examples of the acid component, the following are used: unsaturated dibasic acid such as maleic anhydride, maleic acid, fumaric acid, and itaconic acid. Moreover, the following acids may be used when necessary: saturated dibasic acids, such as phthalic acid, phthalic anhydride, isophthalic acid, terephthalic acid, succinic acid, adipic acid, and sebacic acid; acids other than dibasic acids, such as benzoic acid and trimellitic acid. The alcohol components include polyhydric alcohols that are shown in the above section of polyester polyol.

Component (b): Vinyl Monomer and/or (Meth)Acrylate Monomer

The component (b) of the solar cell-backsheet coating composition of the present invention is a vinyl monomer and/or (meth)acrylate monomer. For example, the following are specific examples of the component: trimethylolpropanetri(meth)acrylate, pentaerythritoltri(meth)acrylate, ethyleneglycoldi(meth)acrylate, tetraethyleneglycoldi(meth)acrylate, polyethyleneglycoldi(meth)acrylate, 1,4-butanedioldi(meth)acrylate, 1,6-hexanedioldi(meth)acrylate, neopentylglycoldi(meth)acrylate, trimethylolpropane trioxyethyl(meth)acrylate, tris(2-hydroxyethyl)isocyanuratetri(meth)acrylate, tris(2-hydroxyethyl)isocyanuratedi(meth)acrylate, and tricyclodecanedimethanoldi(meth)acrylate.

Other examples of the component are: hydroxyethyl(meth) acrylate, 2-hydroxypropyl(meth)acrylate, 2-hydroxybutyl (meth)acrylate, methyl(meth)acrylate, ethyl(meth)acrylate, propyl(meth)acrylate, isopropyl(meth)acrylate, butyl(meth) acrylate, amyl(meth)acrylate, isobutyl(meth)acrylate, t-butyl (meth)acrylate, pentyl(meth)acrylate, isoamyl(meth)acrylate, hexyl(meth)acrylate, heptyl(meth)acrylate, octyl(meth) acrylate, isooctyl(meth)acrylate, 2-ethylhexyl(meth) acrylate, nonyl(meth)acrylate, decyl(meth)acrylate, isodecyl (meth)acrylate, undecyl(meth)acrylate, dodecyl(meth) acrylate, lauryl(meth)acrylate, tetrahydrofurfuryl(meth) acrylate, butoxyethyl(meth)acrylate, ethoxydiethyleneglycol (meth)acrylate, benzyl(meth)acrylate, cyclohexyl(meth) acrylate, phenoxyethyl(meth)acrylate, polyethyleneglycolmono(meth)acrylate, polypropyleneglycolmono(meth)acrylate, methoxyethyleneglycol(meth)acrylate, ethoxyethoxyethyl(meth)acrylate, methoxypolyethyleneglycol(meth)acrylate, methoxypolypropyleneglycol (meth)acrylate, dicyclopentadiene(meth)acrylate, dicyclopentanyl(meth)acrylate, dicyclopentenyl(meth)acrylate, tricyclodecanyl(meth)acrylate, isobornyl(meth)acrylate, bornyl(meth)acrylate, diacetone(meth)acrylamide, isobutoxymethyl(meth)acrylamide, N-vinylpyrrolidone, N-vinylcaprolactam, N,N-dimethyl(meth)acrylamide, t-octyl(meth)acrylamide, dimethylaminoethyl(meth)acrylate, diethylaminoethyl(meth)acrylate, 7-amino-3,7-dimethyloctyl(meth)acrylate, N,N-diethyl(meth)acrylamide, N,N'-dimethylaminopropyl(meth)acrylamide, and (meth)acryloylmorpholine; and vinyl ethers, such as hydroxybutyl vinyl ether, lauryl vinyl ether, cetyl vinyl ether, and 2-ethylhexyl vinyl ether.

The component (b) of the solar cell-backsheet coating composition of the present invention is a vinyl monomer and/or (meth)acrylate monomer, which is preferably a component described below in terms of high hardness expression characteristics, fast drying characteristics, adhesiveness, no-yellowing characteristics, and low-viscosity expression characteristics. The component is at least one type of monomer selected from among the following: a compound (b-1) that includes a cyclic structure and one ethylenically unsaturated group; and a diacrylate compound (b-2). It is more preferred that the compounds (b-1) and (b-2) be used in combination.

(b-1) Compound Including a Cyclic Structure and One Ethylenically Unsaturated Group The component (b-1) that is used in the present invention is a compound that includes a cyclic structure and one ethylenically unsaturated group.

Examples of the component (b), the following are available: (meth)acrylates containing an alicyclic structure, such as isobornyl(meth)acrylate, bornyl(meth)acrylate, tricyclodecanyl(meth)acrylate, and dicyclopentanyl(meth)acrylate; benzyl(meth)acrylate; 4-butylcyclohexyl(meth)acrylate; acryloyl morpholine; vinylimidazole; and vinylpyridine.

Furthermore, the compounds represented by the following formulae (1) to (3) are also available.

[Chemical 1]

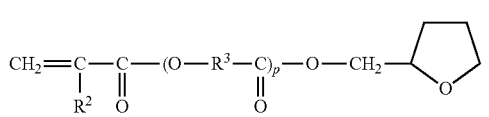

(1)

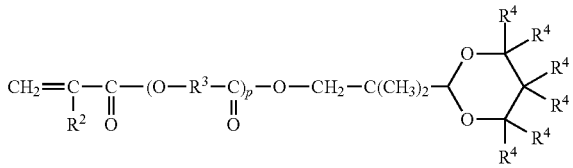

(In the formulae, $R^2$ represents a hydrogen atom or a methyl group; $R^3$ represents an alkylene group with a carbon number of 2 to 8, or preferably 2 to 5; $R_4$ represents a hydrogen atom or a methyl group; p is preferably equal to 1 to 4).

[Chemical 2]

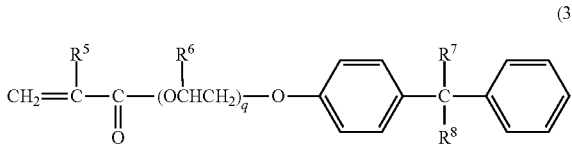

(In the formulae, $R^5$, $R^6$, $R^7$, and $R^8$ are independent of each other, and are H or $CH_3$; q is an integer ranging from 1 to 5)

For the component (b), monomers containing an N-vinyl group are available because the monomers are excellent in high hardness expression characteristics, fast drying characteristics, adhesiveness, no-yellowing characteristics, and low-viscosity expression characteristics. For example, the monomers include N-vinylpyrrolidone, N-vinylcaprolactam, N-vinylformamide, N-vinylimidazole, and N-vinylcarbazole. Among the above substances, N-vinylcaprolactam is preferred because N-vinylcaprolactam is excellent in adhesiveness and low-viscosity expression characteristics.

The component (b-2) that is used in the present invention is diacrylate monomer.

Diacrylate monomers that are used in the present invention include ethylene glycol diacrylate, dipropylene glycol diacrylate (DPGDA), 1,6-hexanediol diacrylate (HDDA), 1,4-butanediol diacrylate, tetraethylene glycol diacrylate, tripropylene glycol diacrylate (TPGDA), PO-modified neopentyl glycol diacrylate, and modified bisphenol A diacrylate. In terms of high hardness expression characteristics, fast drying characteristics, and no-yellowing characteristics, the following are preferred: dipropylene glycol diacrylate and tripropylene glycol diacrylate.

If the components (b-1) and (b-2) are used in combination, at a time when (b-1)+(b-2)=100 parts by mass, a blending ratio thereof is as follows: the component (b-1) is 80 to 20 parts by mass, or preferably 75 to 25 parts by mass; and the component (b-2) is 20 to 80 parts by mass, or preferably 25 to 75 parts by mass.

If the components (b) and (e) are used in combination in the above ratio, the balance of adhesiveness and whiteness is excellent.

(c) Denaturant

The component (c) that is used in the present invention is a denaturant.

The component (c), or denaturant, has a function of improving adhesiveness and curbing volumetric shrinkage in the solar cell-backsheet coating composition of the present invention. In particular, the component (c) makes remarkable contributions to improving adhesiveness for a copolymer of ethylene and vinyl acetate (EVA) and polyester-based resin.

For example, the denaturant (c) may be at least one selected from among a group consisting of: polyol (c-1) with a hydroxyl value of 40 to 330 mgKOH/g; polyol (c-2) with a hydroxyl value of 40 to 330 mgKOH/g and with an acid value of 2 to 20 mgKOH/g; modified rubber (c-3); and compound (c-4) with an epoxy equivalent of 150 to 700 g/mol.

The polyol (c-1) with a hydroxyl value (i) of 40 to 330 mgKOH/g will be described.

The hydroxyl value of the component (c) contributes to improving selective adhesiveness for a copolymer of ethylene and vinyl acetate (EVA) and polyester-based resin (adherend).

Moreover, examples of the polyol (c-1) with a hydroxyl value (i) of 40 to 330 mgKOH/g, the following are available: aromatic system, aliphatic system, polybutadiene system, castor oil system, and polyisoprene system. However, as long as the hydroxyl value is within the above range, any type is excellent in selective adhesiveness to the adherend.

In terms of the above selective adhesiveness, the hydroxyl value (i) is preferably 40 to 330 mgKOH/g, or more preferably 150 to 300 mgKOH/g.

For the polyol (c-1) with a hydroxyl value (i) of 40 to 330 mgKOH/g, in terms of selective adhesiveness to the adherend, the following are more preferred:

Castor oil-based polyol (c-1-1) with a hydroxyl value (i) of 40 to 330 mgKOH/g;

Polybutadiene-based polyol (c-1-2) with a hydroxyl value (i) of 40 to 330 mgKOH/g;

Polyisoprene-based polyol, or a hydrogen additive thereof, (c-1-3) with a hydroxyl value (i) of 40 to 330 mgKOH/g; and Epoxy polyol resin (c-1-4) with a hydroxyl value (i) of 40 to 330 mgKOH/g.

According to the present invention, two or more types of polyol of the component (c) may be mixed for use when necessary.

The following describes castor oil-based polyol (c-1-1) with a hydroxyl value (i) of 40 to 330 mgKOH/g.

The above "castor oil" is a fat that contains a triester compound made from ricinoleic acid and glycerine. Usually, castor oil is a natural fat or a product processed from natural fat.

The above "castor oil" may be a synthetic fat as long as the castor oil contains the above compound. As for the ricinoleic acid that is part of the triester compound contained in the castor oil, it is preferred that the ricinoleic acid account for 90 mol percent or more of a fatty acid that constitutes the entire triester compound. The castor oil may be a processed product such as a hydrogen additive (which is usually made by hydrogenating an unsaturated bond between carbons in the skeleton of ricinoleic acid). Usually, the above triester compound (or hydrogenated triester compound if the triester compound is hydrogenated) contained in the castor oil accounts for 90 mol percent or more (including 100 mol percent) of the entire fat.

The above "castor oil-based polyol" is an ester compound made from ricinoleic acid and/or hydrogenated ricinoleic acid, and polyhydric alcohol. As long as the castor oil-based polyol has the above structure, the castor oil-based polyol may be a polyol that is obtained with castor oil as starting material, or a polyol that is obtained with any material other than castor oil as starting material. The polyhydric alcohol is not specifically restricted.

For the castor oil-based polyol, the following are available: polyols derived from castor oil; and polyols obtained by modifying castor oil.

The polyols derived from castor oil are fatty acid ester-based polyols derived from castor oil, such as those obtained by replacing part of ricinoleic acid of glycerin ester with oleic acid, those obtained by esterification of ricinoleic acid, which is obtained by saponification of castor oil, with trimethylolpropane and other short-molecule polyols, and a mixture of the above substances and castor oil.

For example, the polyols that are obtained by modifying castor oil include: vegetable oil-modified polyols; and modified polyols containing an aromatic skeleton (e.g. bisphenol A or the like). The vegetable oil-modified polyols are obtained by replacing part of ricinoleic acid of glycerin ester with fatty acids obtained from other plants, which for example include higher fatty acids such as linoleic acid, linolenic acid, and oleic acid that are obtained from soybean oil, rape seed oil, olive oil, and the like.

Among the castor oil-based polyols, given the advantageous effects of the present invention, the castor oil-based polyol (c-1-1) with a hydroxyl value (i) of 40 to 330 mgKOH/g of the component is preferred.

Furthermore, in order to improve the toughness (shock resistance), flexibility, and adhesiveness of an adhesion layer, an aromatic castor oil-based polyol (c-1-1-1) with a hydroxyl value (i) of 40 to 330 mgKOH/g is preferred. It is more preferred that the hydroxyl value be 150 to 240 mgKOH/g.

The above component (c-1-1-1) is a modified polyol derived from castor oil, which includes an aromatic skeleton (e.g. bisphenol A or the like). The component (c-1-1-1) is commercially available, for example including "URIC AC series" (by ITOH OIL CHEMICALS CO., LTD.). In particular, an addition product that is obtained by adding bisphenol A and polyalkylene glycol to ricinoleic acid is preferred in terms of adhesiveness to the adherend. For example, the addition product is represented by the following formula (4).

[Chemical 3]

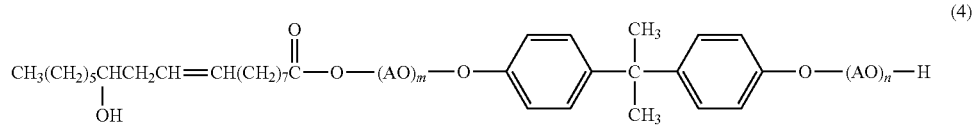

(4)

In the formula (4), "m" represents 2 to 5 on average, and "n" represents 2 to 5 on average.

The modified polyol that is represented by the above formula (4) and derived from castor oil for example can be acquired from ITOH OIL CHEMICALS with product name URIC AC-005 (with a hydroxyl value of 194 to 214 mgKOH/mg, and a viscosity of 700 to 1,500 mPa·s/25° C.), AC-006 (with a hydroxyl value of 168 to 187 mgKOH/mg, and a viscosity of 3,000 to 5,000 mPa·s/25° C.), AC-008 (with a hydroxyl value of 180 mgKOH/mg, and a viscosity of 1,600 mPa·s/25° C.), or AC-009 (with a hydroxyl value of 225 mgKOH/mg, and a viscosity of 1,500 mPa·s/25° C.).

The following describes polybutadiene-based polyol (c-1-2) with a hydroxyl value (i) of 40 to 330 mgKOH/g.

The polybutadiene-based polyols that are used in the present invention, for example, includes: homopolymers, such as 1,2-polybutadienepolyol and 1,4-polybutadienepolyol; copolymers, such as poly(pentadiene butadiene) polyol, and poly(butadiene styrene)polyol, poly(butadiene acrylonitrile)polyol; and polyols of hydrogenated polybutadiene, which are obtained by hydrogenating the above polyols.

Polybutadiene-based polyols are commercially available, for example including the following products manufactured by Idemitsu Kosan CO., LTD.: "Poly bd R-15HT (Hydroxyl value 102.7 mgKOH/mg, Mw1200)" and "Poly bd R-45HT (Hydroxyl value 46.6 mgKOH/mg, Mw2800)."

Given the advantageous effects of the present invention, the hydroxyl value of the polybutadiene-based polyol (c-1-2) is preferably 40 to 330 mgKOH/g, or more preferably 40 to 110 mgKOH/g.

The weight-average molecular weight (GPC method) of the polybutadiene-based polyol (c-1-2) is preferably 50 to 3,000, or more preferably 800 to 1,500.

The following describes polyisoprene-based polyol, or a hydrogen additive thereof, (c-1-3) with a hydroxyl value (i) of 40 to 330 mgKOH/g.

The components (c-1-3) for example include Poly Ip® by Idemitsu Corporation (hydroxyl-terminated liquid polyisoprene). The "Poly Ip®" (Hydroxyl value 46.6 mgKOH/mg, Mn2500) is liquid polymer of a polyisoprene type that is equipped with a highly reactive hydroxyl group at a molecular end.

The hydrogen additives include Epol® by Idemitsu Corporation (hydroxyl-terminated liquid polyolefin) The "Epol®" (Hydroxyl value: 50.5 mgKOH/mg, Mn2500) is liquid polyolefin that is obtained by hydrogenating "Poly Ip®". In the molecule, almost no double bonds remain.

Epoxy polyol resin (c-1-4) with a hydroxyl value (i) of 40 to 330 mgKOH/g

The epoxy polyol resin (c-1-4) with a hydroxyl value (i) of 40 to 330 mgKOH/g, which is used in the present invention, is obtained by reaction of epoxy resin with an active hydrogen compound.

For example, the epoxy resins used here include polyglycidyl ether compounds of mononuclear polyhydric phenol compounds, such as hydroquinone, resorcin, pyrocatechol, and phloroglucinol; polyglycidyl ether compounds of polynuclear polyhydric phenol compounds, such as dihydroxynaphthalene, biphenol, methylene bisphenol (bisphenol F), methylenebis (ortho-cresol), ethylidene bisphenol, isopropylidene bisphenol (bisphenol A), isopropylidenebis (ortho-cresol), tetrabromobisphenol A, 1,3-bis(4-hydroxycumylbenzene), 1,4-bis(4-hydroxycumylbenzene), 1,1,3-tris(4-hydroxyphenyl)butane, 1,1,2,2-tetra(4-hydroxyphenyl)ethane, thiobisphenol, sulfobisphenol, oxybisphenol, phenol novolac, ortho-cresol novolac, ethyl phenol novolac, butylphenol novolac, octylphenol novolac, resorcinol novolac, bisphenol A novolac, bisphenol F novolac, and terpene diphenol; ethylene oxides of the above mononuclear polyhydric phenol compounds or polynuclear polyhydric phenol compounds and/or polyglycidyl ether compounds of propylene oxide adduct; polyglycidyl ether compounds of the above mononuclear polyhydric phenol compounds hydrogenated; polyglycidyl ethers of polyhydric alcohols, such as ethylene glycol, propylene glycol, butylene glycol, hexanediol, polyglycol, thiodiglycol, glycerin, trimethylolpropane, pentaerythritol, sorbitol, and bisphenol A-ethylene oxide adduct; glycidyl esters of aliphatic, aromatic or alicyclic polybasic acid, such as maleic acid, fumaric acid, itaconic acid, succinic acid, glutaric acid, suberic acid, adipic acid, azelaic acid, sebacic acid, dimer acid, trimer acid, phthalic acid, isophthalic acid, terephthalic acid, trimellitic acid, trimesic acid, pyromellitic acid, tetrahydrophthalic acid, hexahydrophthalic acid, and end methylenetetrahydro phthalic acid, and homopolymers or copolymers of glycidyl methacrylate; epoxy compounds including glycidylamino groups, such as N,N-diglycidylaniline and bis(4-(N-methyl-N-glycidylamino)phenyl) methane; epoxy compounds of cyclic olefin compounds, such as vinylcyclohexene diepoxide, dicyclopentadiene diepoxide, 3,4-epoxycyclohexylmethyl-3,4-epoxycyclohexanecarboxylate, 3,4-epoxy-6-methylcyclohexylmethyl-6-methylcyclohexane carboxylate, and bis(3,4-epoxy-6-methylcyclohexylmethyl) adipate; epoxidized and conjugated diene polymers such as epoxidized polybutadiene and epoxidized copolymer of styrene and butadiene, and heterocyclic compounds such as triglycidyl isocyanurate. The above epoxy resins may be internally cross-linked by isocyanate-terminated prepolymers.

Among the above epoxy resins, epoxy resins of a bisphenol type like polyglycidyl ether compounds, which include the following substances, are preferred because the use of the substances enables formation of a coating film that is excellent in adhesiveness, decorative quality, and other characteristics: biphenol, methylene bisphenol (bisphenol F), methylenebis (ortho-cresol), ethylidene bisphenol (bisphenol AD), isopropylidene bisphenol (bisphenol A), isopropylidenebis (ortho-cresol), tetrabromobisphenol A, 1,3-bis(4-4-hydroxycumylbenzene), and 1,4-bis(4-hydroxycumylbenzene).

The epoxy polyol resin (c-1-4) with a hydroxyl value (i) of 40 to 330 mgKOH/g can be obtained by reaction of epoxy groups of the above epoxy resins with active hydrogen compounds such as carboxylic compounds, polyols, and amino compounds.

The above carboxylic compounds include acetic acid, propionic acid, 2,2-dimethylol propionic acid, 12-hydroxystearic acid, lactic acid, butyric acid, octylic acid, ricinoleic acid, lauric acid, benzoic acid, toluic acid, cinnamic acid, phenylacetic acid, aliphatic, aromatic or alicyclic monocarboxylic acid such as cyclohexane carboxylic acid, maleic acid, fumaric acid, itaconic acid, succinic acid, glutaric acid, adipic acid, dimer acid, phthalic acid, isophthalic acid, terephthalic acid, hexahydro acid, and hydroxy polycarboxylic acid.

For example, the above polyols include ethylene glycol, diethylene glycol, 1,2-propylene glycol, 1,3-propylene glycol, 2-methyl-1,3-propylene glycol, 2,2-dimethyl-1,3-propylene glycol, 1,2-butanediol, 1,3-butanediol, 1,4-butanediol, 1,5-pentanediol, 2,2,4-trimethyl-1,5-pentanediol, 1,6-hexanediol, 2-ethyl-1,6-hexanediol, 1,2-octanediol, 1,8-octanediol, 2-methyl-1,8-octanediol, 1,9-nonanediol, 1,10-decanediol, 1,12-octadecanediol, glycerin, trimethylolpropane, pentaerythritol, and other low molecular polyols.

The above amino compounds include dialkyl amine compounds, such as dibutylamine and dioctylamine; alkanolamine compounds such as methyl ethanolamine, butyl ethanolamine, diethanolamine, diisopropanolamine, and dimethylaminopropyl ethanolamine; heterocyclic amine compounds, such as morpholine, piperidine, and 4-methylpiperazine.

Among the above active hydrogen compounds, alkanolamine compounds such as diethanolamine are preferred.

Moreover, chain extension of epoxy resin is also possible with the use of a compound containing two or more active hydrogen groups such as monoethanolamine or monoisopropanolamine.

When reaction of the above epoxy resins with the above active hydrogen compounds take place, a normal method can be employed in adding the active hydrogen compounds to the epoxy resins. For example, what may be used is a method of heating both to 60 to 200 degrees Celsius in the presence of a well-known catalyst such as a tertiary amine compound or phosphonium salt in such a way that the reaction takes place for three to ten hours.

As for the epoxy polyol resin (c-1-4) with a hydroxyl value (i) of 40 to 330 mgKOH/g, given the advantageous effects of the present invention, the preferred hydroxyl value is 100 to 140 mgKOH/g.

Examples of the above epoxy polyol resin (c-1-4) with a hydroxyl value (i) of 40 to 330 mgKOH/g include EPICLON U-125-60BT (Hydroxyl value 100 to 140 mgKOH/g) manufactured by DIC Corporation.

The following describes polyol (c-2) with a hydroxyl value (i) of 40 to 330 mgKOH/g and with an acid value (ii) of 2 to 20 mgKOH/g.

As for the polyol (c-2) with a hydroxyl value (i) of 40 to 330 mgKOH/g and with an acid value (ii) of 2 to 20 mgKOH/g, an improvement can be made in selective adhesiveness to the adherend by satisfying the hydroxyl value (i) and the acid value (ii) even when the polyol is an aromatic, aliphatic, or castor oil-based polyol.

It is more preferred that the hydroxyl value (i) be 230 to 300 mgKOH/g.

It is more preferred that the acid value (ii) be 4 to 15 mgKOH/g.

If (i) and (ii) are satisfied, as example of the polyol (c-2) with a hydroxyl value (i) of 40 to 330 mgKOH/g and with an acid value (ii) of 2 to 20 mgKOH/g, the following is shown:

castor oil-based polyol (c-2-1) with a hydroxyl value (i) of 40 to 330 mgKOH/g and with an acid value (ii) of 2 to 20 mgKOH/g.

The castor oil-based polyol (c-2-1) with a hydroxyl value (i) of 40 to 330 mgKOH/g and with an acid value (ii) of 2 to 20 mgKOH/g is polyol derived from castor oil. For example, as disclosed in Jpn. Pat. Appln. Laid-Open Publication No. 2005-89712, the following are also available: a castor oil-based polyol derived from ricinoleic acid; an acidic phosphate ester compound with a total carbon number of 12 or more; and a polyol composition containing terpene phenols when necessary. The above substances can be acquired for example from ITOH OIL CHEMICALS with product names URIC H-1262 and H2151U.

The above URIC H-1262 from ITOH OIL CHEMICALS is a polyol (Viscosity: 3,500 to 8,500 mPa·s/25° C., Hydroxyl value: 240 to 290 (Unit: mgKOH/g), Acid value: 4 to 15 (Unit: mgKOH/g)) that contains a castor oil-based polyol and an acidic phosphate ester compound with a total carbon number of 12 or more. URIC H-1262 is excellent in adhesiveness to the adherend, particularly in adhesiveness to metal and hydrolysis resistance.

The above URIC H-2151U from ITOH OIL CHEMICALS is a polyol (Viscosity: 3,500 to 8,500 mPa·s/25° C., Hydroxyl value: 240 to 290 (Unit: mgKOH/g), Acid value: 4 to 15 (Unit: mgKOH/g)) that contains a castor oil-based polyol, an acidic phosphate ester compound with a total carbon number of 12 or more, and terpene phenols. URIC H-2151U is excellent in adhesiveness to the adherend, particularly in adhesiveness to metal and hydrolysis resistance.

The following describes modified rubber (c-3).

The modified rubber (c-3) that is used in the present invention includes liquid carboxylated polyisoprene (c-3-1) and carboxylated polybutadiene (c-3-2).

Carboxylated polyisoprene (c-3-1)

The carboxylated polyisoprene (c-3-1) used in the present invention achieves a function of improving wettability of a surface of the adherend and of improving adhesiveness.

The component (c-3-1) may for example be maleated polyisoprene such as LIR-420 manufactured by KURARAY CO., LTD.

Carboxylated polybutadiene (c-3-2)

The carboxylated polybutadiene (c) used in the present invention has an effect of improving adhesiveness to the adherend.

The component (c-3-2) is a transparent, liquid polymer at ambient temperatures, in which the microstructure of a main chain of polybutadiene is of a vinyl 1,2-linked type, a trans 1,4-linked type, and a cis 1,4-linked type. In this case, it is preferred that vinyl 1,2-linkage be less than or equal to 30 percent by weight. It is not preferred that vinyl 1,2-linkage exceeds 30 percent by weight, because the storage stability of an obtained solar cell-backsheet coating composition becomes poor. It is preferred that cis 1,4-linkage be greater than or equal to 40 percent by weight. It is not preferred that cis 1,4-linkage be less than 40 percent by weight, because the adhesiveness of an obtained solar cell-backsheet coating composition decreases.

The component of carboxylated polybutadiene (c-3-2) is obtained by reaction of liquid polybutadiene with a carboxyl group-introducing compound. The ratio of 1,3-butadiene and the carboxyl group-introducing compound, which constitute the liquid polybutadiene, is preferably as follows: 80 to 98 percent by weight of 1,3-butadiene, and 2 to 20 percent by weight of the carboxyl group-introducing compound.

The liquid polybutadiene that is used for the reaction preferably has a number average molecular weight of 500 to 10,000, or more preferably of 1,000 to 7,000. A broad molecular weight distribution is desirable. It is more preferred that the liquid polybutadiene have an iodine value that is measured according to DIN53241, or Iodine 30 to 500 g/Substance 100 g. Furthermore, it is preferred that the liquid polybutadiene have a molecular structure in which cis-double bonds account for 70 to 90 percent, trans-double bonds for 10 to 30 percent, and vinyl double bonds for 0 to 3 percent.

The carboxyl group-introducing compound may be an ethylenically unsaturated dicarboxy compound; for example, ethylenically unsaturated dicarboxylic acid, an anhydride thereof, or monoester may be used. More specifically, the compounds include maleic acid, fumaric acid, itaconic acid, 3,6-tetrahydrophthalic acid, itaconic acid anhydride, 1,2-dimethylmaleic anhydride, maleic acid monomethyl ester, and maleic acid monoethyl ester. Among the above substances, in terms of safety, economic efficiency, and reactivity, maleic anhydride (maleated polybutadiene) is preferred.

A polybutadiene/maleic anhydride-addition product, which includes polybutadiene and maleic anhydride, may be produced by publicly-known method.

According to DIN ISO 3682, the acid value of the maleated liquid polybutadiene is preferably 50 to 120 (mgKOH/g), or more preferably 70 to 90 (mgKOH/g). If the acid value is less than 50 (mgKOH/g), the adhesiveness of an obtained solar cell-backsheet coating composition decreases. If the acid value exceeds 120 (mgKOH/g), the viscosity of an obtained solar cell-backsheet coating composition increases, resulting in a decrease in workability.

Given a balance between the maleated rate of maleated liquid polybutadiene and viscosity, the maleated rate is preferably 6 to 20 percent, or more preferably 6 to 15 percent, or still more preferably 7 to 10 percent.

The viscosity (20 degrees Celsius) of maleated liquid polybutadiene that is measured according to DIN53214 is preferably 3 to 16 Pa·s, or more preferably 5 to 13 Pa·s, or still more preferably 6 to 9 Pa·s.

The vinyl double bonds of maleated liquid polybutadiene are less than or equal to 30 percent. Those having cis-double bonds that are within the above range are higher in flexibility, as well as high in maleated rate (acid value) as described above, than liquid polybutadiene whose cis-double bonds are less than the above lower limit. Therefore, an obtained solar cell-backsheet coating composition is rich in adhesiveness, and is sufficiently polarized. As a result, further flexibility is possible; the adjustment of flexibility is easy.

As for the liquid polybutadiene whose cis-double bonds are less than the above lower limit, the viscosity increases rapidly as the maleated rate increases. However, as for those having cis-double bonds that are within the above range, an increase in viscosity is small. Since the viscosity within the above range is low, there is an increase in reactivity, leading to an improvement in workability. Moreover, as for an obtained solar cell-backsheet coating composition, a UV coating can be applied directly to polyester-based resin. Therefore, the solar cell-backsheet coating composition is excellent in terms of workability and a reduction in the number of man-hours.

Examples of marketed products of maleated liquid polybutadiene, POLYVEST OC 800S®, manufactured by Degussa Corporation, and 1200S are available.

The following describes the compound (c-4) with an epoxy equivalent of 150 to 700 g/mol.

One form of the compound (c-4) with an epoxy equivalent of 150 to 700 g/mol that is used in the present invention is a polyepoxy compound (c-4-1) with an epoxy equivalent of 150 to 250 g/mol.

In the coating composition of the present invention, for the polyepoxy compound (c-4-1) with an epoxy equivalent of 150 to 250 g/mol, for example, the following are available: polyglycidyl ether compounds of mononuclear polyhydric phenol compounds, such as hydroquinone, resorcin, pyrocatechol, and phloroglucinol; polyglycidyl ether compounds of polynuclear polyhydric phenol compounds, such as dihydroxynaphthalene, biphenol, methylene bisphenol (bisphenol F), methylenebis (ortho-cresol), ethylidene bisphenol, isopropylidene bisphenol (bisphenol A), isopropylidenebis (ortho-cresol), tetrabromobisphenol A, 1,3-bis(4-hydroxycumylbenzene), 1,4-bis(4-hydroxy cumyl benzene), 1,1,3-tris(4-hydroxyphenyl)butane, 1,1,2,2-tetra(4-hydroxyphenyl)ethane, thiobisphenol, sulfobisphenol, oxybisphenol, phenol novolac, ortho-cresol novolac, ethyl phenol novolac, butylphenol novolac, octylphenol novolac, resorcinol novolac, and terpene phenol; polyglycidyl ethers of polyhydric alcohols, such as ethylene glycol, propylene glycol, butylene glycol, hexanediol, polyglycol, thiodiglycol, glycerin, trimethylolpropane, pentaerythritol, sorbitol, and bisphenol A-ethylene oxide adduct; glycidyl esters of aliphatic, aromatic or alicyclic polybasic acid, such as maleic acid, fumaric acid, itaconic acid, succinic acid, glutaric acid, suberic acid, adipic acid, azelaic acid, sebacic acid, dimer acid, trimer acid, phthalic acid, isophthalic acid, terephthalic acid, trimellitic acid, trimesic acid, pyromellitic acid, tetrahydrophthalic acid, hexahydrophthalic acid, and end methylenetetrahydro phthalic acid, and homopolymers or copolymers of glycidyl methacrylate; epoxy compounds including glycidylamino groups, such as N,N-diglycidylaniline and bis(4-(N-methyl-N-glycidylamino)phenyl)methane, and diglycidyl ortho-toluidine; epoxy compounds of cyclic olefin compounds, such as vinylcyclohexene diepoxide, dicyclopentadiene diepoxide, 3,4-epoxycyclohexylmethyl-3,4-epoxycyclohexanecarboxylate, 3,4-epoxy-6-methylcyclohexylmethyl-6-methylcyclohexane carboxylate, and bis(3,4-epoxy-6-methylcyclohexylmethyl) adipate; epoxidized and conjugated diene polymers such as epoxidized polybutadiene and epoxidized copolymer of styrene and butadiene, and heterocyclic compounds such as triglycidyl isocyanurate.

Examples of the polyepoxy compound (c-4-1) with an epoxy equivalent of 150 to 250 g/mol that is used in the present invention, the following are more preferred in terms of adhesiveness: polyglycidyl ethers of bisphenol compounds, such as biphenol, methylene bisphenol (bisphenol F), methylenebis (ortho-cresol), ethylidene bisphenol, isopropylidene bisphenol (bisphenol A), isopropylidenebis (ortho-cresol), tetrabromobisphenol A, 1,3-bis(4-hydroxycumylbenzene), 1,4-bis(4-hydroxycumylbenzene), 1,1,3-tris(4-hydroxyphenyl)butane, 1,1,2,2-tetra(4-hydroxyphenyl)ethane, thiobisphenol, sulfobisphenol, oxybisphenol, and terpene diphenol.

As an example of polyglycidyl ether of bisphenol compound with an epoxy equivalent of 150 to 250 g/mol, the following is shown: ADEKA RESIN EP-4100E (manufactured by ASAHI DENKA KOGYO; bisphenol A diglycidyl ether, Epoxy Equivalent 190).

Another form of the compound (c-4) with an epoxy equivalent of 150 to 700 g/mol that is used in the present invention is a polyolefin-based polymer (c-4-2) with an epoxy equivalent of 500 to 700 g/mol. Preferably, the polymer is a polyolefin-based polymer which has a hydroxyl group at one end and into which an epoxy group has been introduced. It is more preferred that the polymer be liquid.

A specific example of the polymer (c-4) with an epoxy equivalent of 150 to 700 g/mol is L-207 (KRATON LIQUID®; also known as L-207 POLYMER) manufactured by KURARAY. L-207 is a polymer having a fully saturated skeleton (epoxidized ethylene.propylene-ethylene.butylene-OH structure) with an epoxy equivalent of 590 g/mol, a hydroxyl equivalent of 7,000 g/mol, and a glass transition temperature of −53 degrees Celsius. The reason why L-207 is used in the present invention is that L-207 is preferred in terms of adhesiveness.

(d) Ultraviolet Curing Agent

The solar cell-backsheet coating composition of the present invention requires an ultraviolet curing agent (d) as essential component.

In the coating composition of the present invention, oligomer components (e.g. vinyl ester resin and unsaturated polyester resin (a)) include double bonds such as those of (meth) acryloyl groups. Therefore, if an ultraviolet curing agent is added, it is possible to easily cure for a short period of time by emitting ultraviolet rays with the use of an ultraviolet fluorescent lamp or high-pressure mercury vapor lamp.

For the ultraviolet curing agent, for example, the following are available: benzophenone, 2,4-dihydroxybenzophenone, 2-hydroxyl-4-methoxy benzophenone, acetophenone, benzoin, benzoin ethyl ether, benzoin-n-propyl ether, benzoin isopropyl ether, benzoin-n-butyl ether, benzoin isobutyl ether, benzyl-1-(4-isopropylphenyl)-2-hydroxy-2-methyl-propane-1-one, 2-hydroxyl-2-methyl 1-phenylpropane-1-one, benzyl sulfide, thioxanthone, bis(2,4,6-trimethylbenzoyl)-phenylphosphine oxide, and 2-chlorothioxanthone.

(e) White Colorant

The solar cell-backsheet coating composition of the present invention requires a white colorant (e) as essential component.

For the component (e), for example, the following are available: basic lead carbonate, basic lead sulfate, basic lead silicate, zinc flower (Specific Weight 5.47 to 5.61), zinc sulfide (Specific Weight 4.1), lithopone, antimony trioxide (Specific Weight 5.5 to 5.6), titanium dioxide (Specific Weight 4.2), and black lead (Specific Weight 3.3). One of the above components may be used, or two or more may be mixed for use.

It is preferred that the component (e) that contains titanium dioxide or zinc sulfide as main component be used. In particular, titanium dioxide is preferred. Based on different crystal lattices of titanium dioxides, titanium dioxides are classified into a tetragonal type and an orthorhombic type. The tetragonal type has two more types: an anatase type (low-temperature type) and a rutile type (high-temperature type). The orthorhombic type includes a brookite type. According to the present invention, the use of titanium dioxide of a rutile type whose photocatalytic action has been inactivated is preferred.

The shape of the component (e) may be of a spheroidal structure, an elliptical structure, a needle-like structure, a polygonal structure, or an amorphous structure.

The particle diameter of the component (e) is not specifically restricted, as long as the diameter is smaller than the thickness of a cured coating. For example, if the thickness of the cured coating is about 10 to 30 μm, the particle diameter is about 0.01 to 3.0 μm, in which case the adhesiveness to the adherend can be appropriately maintained.

(Blending Ratio of Solar Cell-Backsheet Coating Composition)

In the solar cell-backsheet coating composition of the present invention, in terms of water-vapor barrier properties, adhesiveness, transparency, and low-viscosity expression characteristics, 10 to 40 mass % of the component (a) is blended. A more preferred blending ratio of the component (a) is 15 to 35 mass % in terms of water-vapor barrier properties and adhesiveness.

If the amount of the component (a) blended exceeds 40 mass %, the viscosity and adhesiveness will deteriorate. If the amount is less than 10 mass %, the adhesiveness and water resistance will deteriorate.

In the solar cell-backsheet coating composition of the present invention, in terms of low-viscosity expression characteristics, adhesiveness, and transparency, 30 to 70 mass % of the component (b) is blended. A more preferred blending ratio of the component (b) is 40 to 65 mass % in terms of low-viscosity expression characteristics, adhesiveness, and transparency.

If the amount of the component (b) blended exceeds 70 mass %, the adhesiveness will deteriorate. If the amount is less than 30 mass %, the viscosity will deteriorate.

In the solar cell-backsheet coating composition of the present invention, in terms of adhesiveness, transparency, and low-viscosity expression characteristics, 5 to 40 mass % of the component (c) is blended. A more preferred blending ratio of the component (c) is 10 to 30 mass % in terms of adhesiveness and low-viscosity expression characteristics. It is particularly preferred that the blending ratio be 10 to 25 mass %.

If the amount of the component (c) blended exceeds 40 mass %, the adhesiveness, transparency, and viscosity will deteriorate. If the amount is less than 5 mass %, the adhesiveness will decrease.

In the solar cell-backsheet coating composition of the present invention, in terms of a practical light curing time (irradiation of 10 seconds or less at an irradiation strength of 500 mJ/cm$^2$), 0.1 to 15 parts by mass of the component (d) are blended relative to 100 parts by mass in total of the components (a) to (c). A more preferred blending ratio of the component (d) is 1 to 10 parts by mass in terms of a practical light curing time (irradiation of 3 seconds or less at an irradiation strength of 500 mJ/cm$^2$). It is particularly preferred that the blending ratio be 2 to 5 parts by mass.

If the amount of the component (d) blended exceeds 15 parts by mass, the transparency and volumetric shrinkage will decrease. If the amount is less than 0.1 parts by mass, the adhesiveness and water-vapor barrier properties will become poorer because light curing is insufficient.

In the solar cell-backsheet coating composition of the present invention, in terms of energy efficiency associated with sunlight reflection, 5 to 20 parts by mass of the component (e) are blended relative to 100 parts by mass in total of the components (a) to (c).

If the amount of the component (e) exceeds 20 parts by mass, the application properties of coating, adhesiveness, curable properties, and water resistance will deteriorate.

If the amount is less than 5 parts by mass, the efficiency of reflecting sunlight will deteriorate.

In the solar cell-backsheet coating composition of the present invention, various additives may be blended when necessary.

The most preferred optional ingredient is a flame retardant.

The flame retardants for example include phosphorus-based flame retardants, bromine-based flame retardants, chlorine-based flame retardants, other aluminum hydroxides, and zinc borate.

If a flame retardant is used, the amount of the flame retardant blended is 50 to 160 parts by mass, or preferably 80 to 140 parts by mass relative to 100 parts by mass in total of the components (a) to (c).

According to the coating of the present invention, direct coating is possible for substrate of polyester-based resin (film) If it is possible to overcome problems such as costs, and to provide a primer layer, a more powerful adhesive force can be obtained.

The viscosity at 25 degrees Celsius of the solar cell-backsheet coating composition of the present invention is not specifically limited. However, the viscosity is preferably less than or equal to 3,000 mPa·s, or more preferably 100 to 2,000 mPa·s. If the viscosity is within the above range, the storage stability obtained is stable with no separation associated with temporal change. Moreover, air bubble is less likely to emerge, and a smooth surface can be obtained. Incidentally, the viscosity can be measured by B-type viscometer.

As an example of the method of preparing the solar cell-backsheet coating composition of the present invention, in a container equipped with a stirrer, to the component (a), the components (b) and (c) are added as reactive diluents. As an addition method, first the component (b) is added to the component (a), and is stirred sufficiently at normal temperatures. If the viscosity is too high, the components may be heated to 100 degrees Celsius or less during the stirring. If the temperature exceeds 100 degrees Celsius, vapor of the component (b) would be remarkably generated, which is not preferred in terms of working environment. After that, the component (c) is added and stirred. At a time when the liquid temperature comes to a normal temperature, the component (b) is added and sufficiently stirred until no residues are left. Incidentally, the timing of adding the component (e) is not specifically restricted. However, adding the component (e) at the end of the process is desirable because the component (e) can be spread evenly.

If other ingredients are added, the ingredients are added at the end of the process and stirred sufficiently.

The solar cell-backsheet coating composition, which is obtained after the stirring, may be promptly processed, or be stored in a cool dark place.

The solar cell backsheet of the present invention includes a layer (A) of the solar cell-backsheet coating composition, and a layer (B) made from polyester-based resin. According to a preferred embodiment, the solar cell backsheet of the present invention includes the layer (A) of the solar cell-backsheet coating composition on the layer (B) that is made from polyethylene terephthalate (PET), which is polyester-based resin.

A method of producing the solar cell backsheet of the present invention may follow a conventional, publically-known production method, and is not specifically restricted. For example, onto the layer (B) that is made from polyester-based resin (or preferably polyethylene terephthalate PET), the layer (A) of the solar cell-backsheet coating composition is applied. As examples of the application method, the following methods are preferably employed: spin coating method, (doctor) knife coating method, micro gravure coating method, direct gravure coating method, offset gravure method, reverse gravure method, reverse roll coating method, (Meyer) bar coating method, die coating method, spray coating method, and dip-coating method. For example, as a device of spin coating method, a manual spinner (ASS-301 by Able Inc) is available.

The thickness of the layer (A) (cured coating) of the coating composition is not specifically limited. However, the thickness is about 2 μm to 50 μm, or preferably 5 μm to 30 μm, or still more preferably 8 μm to 20 μm. (The contraction of the coating composition of the present invention is small during a curing process if the coating composition is blended in a solventless (volatile) way. Therefore, there is no large difference between the coating thickness and the thickness of the cured film.) By making adjustments to the coating thickness, it is possible to make the transparency excellent, to mitigate the strength of the warping of the resin molding body, which is associated with cure shrinkage, and to prevent a decline in surface hardness, which is associated with uncured binder resin components.

Then, the layer (A) of the coating composition is irradiated with ultraviolet rays and cured. In this manner, the solar cell backsheet is prepared.

Then, in order to produce a solar cell module, on the solar cell backsheet of the present invention, a sealing-material layer that is made from EVA is formed. In the sealing-material layer, a solar cell is contained. A method of forming the sealing-material layer may follow a conventional, publically-known method, and is not specifically restricted. The following may be stacked in the order described below: tempered glass, an EVA sheet, a solar cell, an EVA sheet, and a solar cell backsheet of the present invention. Then, the above components are heated and bonded together by vacuum laminating method.

Incidentally, the above methods of preparing the solar cell backsheet and of preparing the solar cell module are simply shown as one example. A person of ordinary skill in the art can make various modifications.

EXAMPLES

Hereinafter, the present invention will be described in more detail in Examples and Comparative Examples. However, the present invention is not limited to the examples described below.

Ingredients that were used in Examples and Comparative Examples were as follows
Component (a-1) Vinyl Ester Resin
(i) Urethane Acrylate
Manufactured by Sartomer Company, CN963B80, Urethane acrylate (HDDA blend), Type=Polyester, 60° C. viscosity=1,100, Number of functional groups=2

(ii) Polyester Acrylate
Manufactured by Sartomer Company, CN292, Polyester acrylate, Type=Aliphatic polyester, 25° C. viscosity=630, Number of functional groups=4
(iii) Epoxy Acrylate
Manufactured by Sartomer Company, CNUVE151, Epoxy acrylate, Type=Polyester, 25° C. viscosity=150,000, Number of functional groups=2
(iv) Aliphatic Urethane Acrylate
Manufactured by Sartomer Company, CN966J75, Aliphatic urethane acrylate (IBOA blend), Type=Polyester, 60° C. viscosity=4,240, 25° C. viscosity=105,000, Number of functional groups=2
Component (a-2) Unsaturated Polyester Resin
Manufactured by SHOWA HIGHPOLYMER CO., LTD., RIGOLAC 21E-A-2®
Component (b) Compound Including a Cyclic Structure and One Ethylenically Unsaturated Group
(i) N-Vinylpyrrolidone, Manufactured by Nippon Shokubai Co., Ltd.
Molecular weight: 111.14
Boiling point: 219 degrees Celsius
Vapor pressure (24 degrees Celsius): 0.10: mm Hg
Flash point: 98° C.
Viscosity (25° C.): 2 cps
Melting point: 13° C.
(ii) N-Vinyl Caprolactam, Manufactured by BASF Corporation
Boiling point: 117° C. (10: mm Hg)
Vapor pressure <0.1 mm Hg (20 degrees Celsius)
Flash point: 110° C.
Melting point: 35° C.
Viscosity: 3.5 cps (40° C.)
Component (c) Denaturant
(c-1-2) Polybutadiene-Based Polyol
Manufactured by Idemitsu Kosan CO., LTD., Poly bd R-15HT
Viscosity: 1.5 Pas/30° C., Hydroxyl value: 102.7 mgKOH/g
(c-1-1-1) Aromatic Castor Oil-Based Polyol
Manufactured by ITOH OIL CHEMICALS, URIC® AC-006, Polyol derived from castor oil that is represented by the above formula (4), Viscosity: 0.7 to 1.5 Pa·s/25° C., Hydroxyl value: 194 to 214 mgKOH/g
(c-1-3) Polyisoprene-Based Polyol
Manufactured by Idemitsu Kosan CO., LTD., Poly Ip®, liquid polymer of a polyisoprene type that is equipped with a highly reactive hydroxyl group at a molecular end (Hydroxyl value: 46.6 mgKOH/mg, Number average molecular weight Mn:=:2500)
(c-2-1) Castor Oil-Based Polyol
URIC H-1262 by ITOH OIL CHEMICALS
Polyol containing castor oil-based polyol and an acidic phosphate ester compound with a total carbon number of 12 or more, Viscosity: 3,500 to 8,500 Pas/25: ° C., Acid value: 4 to 15 (Unit: mgKOH/g),
Hydroxyl value: 240 to 290 (Unit: mgKOH/g)
(c-2-1) Castor Oil-Based Polyol
URIC H-2151U by ITOH OIL CHEMICALS
Polyol containing castor oil-based polyol, an acidic phosphate ester compound with a total carbon number of 12 or more, and terpene phenols, Viscosity: 3,500 to 8,500 Pa·s/25: ° C., Acid value: 4 to 15 (Unit: mgKOH/g), Hydroxyl value: 240 to 290 (Unit: mgKOH/g)

(c-1-3) Hydrogen Additive of Polyisoprene-Based Polyol

Manufactured by Idemitsu Kosan CO., LTD., Epol®, hydroxyl-terminated liquid polyolefin (Viscosity (Pas/30° C.) 75, Hydroxyl value (mgKOH/g) 50.5, Number average molecular weight 2,500)

(c-3-1) Maleated Polyisoprene

LIR-420 by KURARAY CO., LTD. (Acid value (mgKOH/g) 40)

(c-3-2) Maleic Acid-Modified Polybutadiene

Manufactured by SARTOMER, Ricon130MA8 (Viscosity (Pa·s/30: ° C.) 6.5, Acid value (mgKOH/g) 46, Number average molecular weight 2,700)

(C-3-2) Maleic Acid-Modified Polybutadiene

Manufactured by EVONIK, POLYVEST® OC 800 S, (1,4-cis-double bonds in polybutadiene: 75 percent, 1,4-trans-double bonds: 24 percent, vinyl bonds: 1 percent, Maleated rate: 7.5 percent, Number average molecular weight: 3,300 (GPC), Weight-average molecular weight: 13, 60:0 (GPC), Viscosity (20 degrees Celsius): 6 to 9 Pa·s (measured by DIN53214), Acid value: 70 to 90 mgKOH/g, Iodine value: 380 to 420 g/100 g, (Polymerization by Ziegler-Natta catalyst))

(c-1-4) Epoxy Polyol Resin
EPICLON® U-125-60BT by DIC (Viscosity (Pas/30° C.) 70, Hydroxyl value (mgKOH/g) 120)

(c-4-1) Polyepoxy Compound with an Epoxy Equivalent of 150 to 250 g/mol

ADEKA RESIN EP-4100E (manufactured by ASAHI DENKA KOGYO; bisphenol A diglycidyl ether, Epoxy Equivalent 190)

(C-4-2) Polymer with an Epoxy Equivalent of 500 to 700 g/mol that Includes a Saturated Skeleton Manufactured by KURARAY CO., LTD., L-207 (KRATON LIQUID®; also known as L-207POLYMER) (a polymer having a fully saturated skeleton (epoxidized ethylene.propylene-ethylene.butylene-OH structure) with an epoxy equivalent of 590 g/mol, a hydroxyl equivalent of 7,000 g/mol, and a glass transition temperature of −53 degrees Celsius)

The characteristics of each polyol were measured in the following manner:

Viscosity Measurement Method

As a viscometer, according to JIS K7117-1, a single cylinder rotational viscometer (B-type TVC-5) was used for measurement. 1. A 500 ml beaker (standard) was used for the measuring instrument. 2. For standard rotors, two types were selected from the following: M1 to M4 rotors for low- and middle-viscosity, and H1 to H7 rotors for middle- to high-viscosity Hydroxyl Value Measurement Method The hydroxyl value means the amount of potassium hydroxide (mg) required for acetylation of OH groups in 1 g of a sample. Based on JIS K 1557-1, acetylation of OH groups in the sample was carried out with the use of acetic anhydride, and acetic acids that were not used were titrated in a potassium hydroxide solution.

$$\text{Hydroxyl value} = \frac{(A-B) \times f \times 28.05}{\text{Sample(g)}} + \text{Acid value} \quad \text{[Formula 1]}$$

A: The amount of a 0.5 mol/l potassium hydroxide ethanol solution (ml) used for blank test
B: The amount of a 0.5 mol/l potassium hydroxide ethanol solution (ml) used for titration f: Factor Acid Value Measurement Method Represented by the amount of potassium hydroxide (mg) required to neutralize acidic components contained in 1 g of sample oil. In accordance with JIS K 1557-5:

(1) Measurement of End-Point pH

Into a 200 mL beaker, 10 mL of a buffer stock solution B was taken. Then, 100 mL of a titration solvent was added, and electrodes were immersed therein. The pH whose change was within 0.1 pH for 30 seconds was regarded as an end point of buffer.

(2) Measurement of Acid Value 1. 20 g of the sample was precisely weighted into a 200 mL beaker.

2. 125 mL of a solvent of toluene, 2-propanol, and pure water combined was added, and titrated with a 0.1 mol/L potassium hydroxide titrant.

As a result of (1), 11.72 pH was set as an end point, and the acid value was calculated by the following formula. The same procedure was used to calculate that of the blank.

$$\text{Acid value (mgKOH/g)} = (D-B) \times K \times F \times M/S$$

D: Titration value (mL)
B: Blank (0.085 mL)
K: Molecular weight of KOH (56.1)
F: Factor of titrant (1.000)
M: Mol concentration of titrant (0.1 mol/L)
S: The amount of sample collected (g)

Component (d) Ultraviolet Curing Agent
(i) Photopolymerization Initiator

Manufactured by CIBA, IRGACURE® 819, bis(2,4,6-trimethylbenzoyl)-phenylphosphine oxide Component (e) White Colorant Titanium oxide, manufactured by Ishihara Sangyo Kaisha, Ltd., CR-90 (Product name)

Optional Ingredient: Flame Retardant

Phosphorus-based flame retardant, manufactured by DAIHACHI CHEMICAL INDUSTRY CO., LTD., PX-200 (Product name), Condensation-type phosphate ester, Phosphate ester dimer Examples 1 to 22

Comparative Examples 1 to 6

In accordance with the blending ratios (parts by mass) shown in Tables 1 to 7 below, the component (a) was put into a container equipped with a stirrer. Then, the component (b) was added and stirred sufficiently at normal temperatures. After that, the component (c) was added and stirred. Then, at a time when the liquid temperature came to a normal temperature, the component (d) was added and stirred sufficiently until no residues were left. Finally, the component (e) was added and stirred. As a result, a solar cell-backsheet coating composition was obtained. The viscosity (mPa·s) at 25 degrees Celsius of the obtained solar cell-backsheet coating composition was measured. That is, a handy-type digital viscometer, TVC-7-type viscometer (TOKI SANGYO CO., LTD.), was used. Moreover, depending on the viscosity, an appropriate rotor (No. 0 to 5) was used to measure the 25-degrees-Celsius viscosity. The results are shown in Tables 1 to 7.

Then, on the polyethylene terephthalate PET (Product Name EMC307, manufactured by Toyobo Co., Ltd.) (Size: 150 mm×25 mm×1 mm in thickness), the coating composition was applied by spin coating method (with a coating thickness of 15 to 20 μm), and was irradiated with ultraviolet rays with an energy of 500 mJ/cm² under the air so as to be cured. In this manner, the laminated body was prepared.

Separately, on the copolymer of ethylene and vinyl acetate EVA (Product Name KA-30, manufactured by Sumitomo Chemical Co., Ltd.; the amount of vinyl acetate contained was 28 percent) (Size: 150 mm×25 mm×1 mm in thickness), the coating composition was applied by spin coating method (with a coating thickness of 15 to 20 μm), and was irradiated with ultraviolet rays with an energy of 500 mJ/cm² under the air so as to be cured. In this manner, the laminated body was prepared.

For the obtained laminated bodies, a cross-cut tape test was conducted as described below.
(Adhesion Test: Cross-Cut Tape Test)

Measurement was carried out in the following manner in compliance with the cross-cut tape test method defined in Japanese Industrial Standard K5400.

Cross-cut tape test (Cross-cut Test, Coating thickness 15 to 20 μm (Spin coating method)): On a test surface (the side of the layer (A) of the coating composition), cuts were made in a 1×1 mm square, grid pattern with the use of a cutter knife. A cutter guide was used. The number of cross-cut sections was: 10 in vertical direction×10 in horizontal direction ~100 pieces. A cellophane tape was strongly and compressively bonded onto the places where the cross-cut sections were made. Then, the cellophane tape was swiftly peeled off at an angle of 45 degrees at an end of the tape. The state of the cross-cut sections (or the number of cross-cut sections that remained there without being peeled off) was observed.

The results are shown in Tables 1 to 7.
(Water Resistance Test)

As for the laminated bodies thus obtained, samples were immersed in boiling water (pure water) for one hour. After that, the samples were dried naturally in a room, and visual observation was carried out to check whether or not the appearance of a hard coat layer had deteriorated.
o: No peeling or cracking occurs (immersed in one hour)
x: peeling or cracking occurs (immersed in one hour)

Different-Materials Adhesiveness Test (Polyester-Based Resin Vs Copolymer of Ethylene and Vinyl Acetate)

A different-materials adhesiveness test was conducted by measurement of shear bond strength as described below. The results are shown in Tables 1 to 7.

On a layer (B1) of the polyethylene terephthalate PET (Product Name EMC307, manufactured by Toyobo Co., Ltd.) with size 150 mm×1 mm in thickness×25 mm in width, the above coating composition was applied by spin coating method (with a coating thickness of 15 to 20 μm) to form the layer (A) of the coating composition. Furthermore, on the layer (A), a layer (B2) of the copolymer of ethylene and vinyl acetate EVA (Product Name KA-30, manufactured by Sumitomo Chemical Co., Ltd.; the amount of vinyl acetate contained was 28 percent), which was shown in Tables 1 to 8 and had the same size as the above (B1), was compressively bonded. The layer (B1)'s side was then irradiated with UV rays (Wavelength: 325 nm, Total irradiation strength: 50 mJ/cm²) so as to be UV-cured. In this manner, a laminated body was prepared. After that, the layer (B2) was pulled in a direction parallel to a joint surface of the layer (A). The tensile strength was measured at the time of break. The results are shown in Tables 1 to 7 in the form of "PET vs EVA."
(Weather Resistance Test)

The appearance of the laminated bodies produced in the adhesion test was evaluated after 2,000 hours of exposure with a cycle of 12 minutes of rainfall and 48 minutes of drying at a black-panel temperature of 63 degrees Celsius with the use of a sunshine weather meter. The results are shown in Tables 1 to 7.
o: No change in appearance
x: occurrence of bleaching, yellowing, or peeling
(Flame Resistance Test)

In a combustion test, measurement was carried out in accordance with safety standard UL94 of Underwriters Laboratories Inc. (o: Burning time 10 seconds or less, A: 10 seconds or more of Burning, x: Entirely burned). The results were shown in Tables 1 to 7.

TABLE 1

| Components | | Ex 1 | Ex 2 | Ex 3 | Ex 4 | Ex 5 |
|---|---|---|---|---|---|---|
| (a-1) (i) | CN975 urethane acrylate by Sartomer | | | | | 30 |
| (a-1) (ii) | CN292 polyester acrylate by Sartomer | | | | | |
| (a-1) (iii) | CNUVE151 epoxy acrylate by Sartomer | 30 | 30 | 30 | 30 | |
| (a-1) (iv) | CN963B80 urethane acrylate by Sartomer | | | | | |
| (a-2) | LIGOLAC21E-A-2 by Showa Highpolymer | | | | | |
| (b-1) (i) | N-vinyl caprolactam | 60 | 40 | 40 | 20 | 60 |
| (b-2) (i) | Dipropylene glycol diacrylate (DPGDA) | | 20 | | 40 | |
| (b-2) (ii) | Tripropylene glycol diacrylate (TPGDA) | | | 20 | | |
| (c-1-2) | Polybutadiene-based polyol Poly bd R-15HT | | | | | |
| (c-1-1-1) | Aromatic castor oil-based polyol URIC AC-006 | 10 | 10 | 10 | 10 | 10 |
| (c-1-3) | Polyisoprene-based polyol Poly ip | | | | | |
| (c-2-1) | Castor oil-based polyol URIC H-1262 | | | | | |
| (c-2-1) | Castor oil-based polyol URIC H-2151U | | | | | |
| (c-1-3) | Hydroxyl-terminated liquid polyolefin Epol | | | | | |
| (c-3-1) | Maleated polyisoprene LIR-420 | | | | | |
| (c-3-2) | Maleic acid-modified polybutadiene Ricon130MA8 | | | | | |
| (c-3-2) | 800 S | | | | | |
| (c-1-4) | Epoxy polyol EPICLON U-125-60BT | | | | | |
| (c-4-1) | Polyepoxy compound ADEKA RESIN EP-4100E | | | | | |
| (c-4-2) | L-207 | | | | | |
| (d) (i) | IRGACURE 819 | 5 | 5 | 5 | 5 | 5 |
| (e) | Titanium oxide by Ishihara Sangyo CR-90 | 10 | 10 | 10 | 10 | 10 |
| (f) | Phosphorus-based flame retardant by DAIHACHI CHEMICAL INDUSTRY PX-200 | 100 | 100 | 100 | 100 | 100 |
| | Total (parts by mass) of components (a) to (d) | 105 | 105 | 105 | 105 | 105 |
| Evaluation results | Viscosity mPa·s(25° C.) | 1300 | 1600 | 1600 | 1000 | 1050 |
| | Adhesiveness test | | | | | |
| | EVA | 100 | 100 | 100 | 100 | 100 |
| | PET | 100 | 100 | 100 | 100 | 100 |

TABLE 1-continued

| Components | | Ex 1 | Ex 2 | Ex 3 | Ex 4 | Ex 5 |
|---|---|---|---|---|---|---|
| | Water resistance test | | | | | |
| | EVA | ○ | ○ | ○ | ○ | ○ |
| | PET | ○ | ○ | ○ | ○ | ○ |
| | Different-materials adhesiveness test | | | | | |
| | PET vs EVA | 7.8 | 7.2 | 7.1 | 6.9 | 7.2 |
| | Weather resistance test | ○ | ○ | ○ | ○ | ○ |
| | Flame resistance | ○ | ○ | ○ | ○ | ○ |

TABLE 2

| Components | | Ex 6 | Ex 7 |
|---|---|---|---|
| (a-1) (i) | CN975 urethane acrylate by Sartomer | | |
| (a-1) (ii) | CN292 polyester acrylate by Sartomer | | |
| (a-1) (iii) | CNUVE151 epoxy acrylate by Sartomer | | |
| (a-1) (iv) | CN963B80 urethane acrylate by Sartomer | 30 | 30 |
| (a-2) | LIGOLAC21E-A-2 by Showa Highpolymer | | |
| (b-1) (i) | N-vinyl caprolactam | 30 | 30 |
| (b-2) (i) | Dipropylene glycol diacrylate (DPGDA) | 30 | |
| (b-2) (ii) | Tripropylene glycol diacrylate (TPGDA) | | 30 |
| (c-1-2) | Polybutadiene-based polyol Poly bd R-15HT | | |
| (c-1-1-1) | Aromatic castor oil-based polyol URIC AC-006 | 10 | 10 |
| (c-1-3) | Polyisoprene-based polyol Poly ip | | |
| (c-2-1) | Castor oil-based polyol URIC H-1262 | | |
| (c-2-1) | Castor oil-based polyol URIC H-2151U | | |
| (c-1-3) | Hydroxyl-terminated liquid polyolefin Epol | | |
| (c-3-1) | Maleated polyisoprene LIR-420 | | |
| (c-3-2) | Maleic acid-modified polybutadiene Ricon130MA8 800 S | | |
| (c-1-4) | Epoxy polyol EPICLON U-125-60BT | | |
| (c-4-1) | Polyepoxy compound ADEKA RESIN EP-4100E | | |
| (c-4-2) | L-207 | | |
| (d) (i) | IRGACURE 819 | 5 | 5 |
| (e) | Titanium oxide by Ishihara Sangyo CR-90 | 10 | 10 |
| (f) | Phosphorus-based flame retardant by DAIHACHI CHEMICAL INDUSTRY PX-200 | 100 | 100 |
| | Total (parts by mass) of components (a) to (d) | 105 | 105 |
| Evaluation results | Viscosity mPa·s(25° C.) | 1000 | 1000 |
| | Adhesiveness test | | |
| | EVA | 100 | 100 |
| | PET | 100 | 100 |
| | Water resistance test | | |
| | EVA | ○ | ○ |
| | PET | ○ | ○ |
| | Different-materials adhesiveness test | | |
| | PET vs EVA | 7.5 | 7.4 |
| | Weather resistance test | ○ | ○ |
| | Flame resistance | ○ | ○ |

TABLE 3

| Components | | Ex 8 | Ex 9 | Ex 10 | Ex 11 | Ex 12 |
|---|---|---|---|---|---|---|
| (a-1) (i) | CN975 urethane acrylate by Sartomer | | | | | |
| (a-1) (ii) | CN292 polyester acrylate by Sartomer | 30 | | | | |
| (a-1) (iii) | CNUVE151 epoxy acrylate by Sartomer | | | 30 | 30 | 30 |
| (a-1) (iv) | CN963B80 urethane acrylate by Sartomer | | 30 | | | |
| (a-2) | LIGOLAC21E-A-2 by Showa Highpolymer | | | | | |
| (b-1) (i) | N-vinyl caprolactam | 60 | 60 | 60 | 60 | 60 |
| (b-2) (i) | Dipropylene glycol diacrylate (DPGDA) | | | | | |
| (b-2) (ii) | Tripropylene glycol diacrylate (TPGDA) | | | | | |
| (c-1-2) | Polybutadiene-based polyol Poly bd R-15HT | | | | | |
| (c-1-1-1) | Aromatic castor oil-based polyol URIC AC-006 | 10 | 10 | | | |
| (c-1-3) | Polyisoprene-based polyol Poly ip | | | 10 | | |

TABLE 3-continued

| Components | | Ex 8 | Ex 9 | Ex 10 | Ex 11 | Ex 12 |
|---|---|---|---|---|---|---|
| (c-2-1) | Castor oil-based polyol URIC H-1262 | | | | 10 | |
| (c-2-1) | Castor oil-based polyol URIC H-2151U | | | | | 10 |
| (c-1-3) | Hydroxyl-terminated liquid polyolefin Epol | | | | | |
| (c-3-1) | Maleated polyisoprene LIR-420 | | | | | |
| (c-3-2) | Maleic acid-modified polybutadiene Ricon130MA8 | | | | | |
| (c-3-2) | 800 S | | | | | |
| (c-1-4) | Epoxy polyol EPICLON U-125-60BT | | | | | |
| (c-4-1) | Polyepoxy compound ADEKA RESIN EP-4100E | | | | | |
| (c-4-2) | L-207 | | | | | |
| (d) (i) | IRGACURE 819 | 5 | 5 | 5 | 5 | 5 |
| (e) | Titanium oxide by Ishihara Sangyo CR-90 | 10 | 10 | 10 | 10 | 10 |
| (f) | Phosphorus-based flame retardant by DAIHACHI CHEMICAL INDUSTRY PX-200 | 100 | 100 | 100 | 100 | 100 |
| Evaluation results | Total (parts by mass) of components (a) to (d) | 105 | 105 | 105 | 105 | 105 |
| | Viscosity mPa·s(25° C.) | 340 | 1350 | 1350 | 1400 | 1380 |
| | Adhesiveness test | | | | | |
| | EVA | 100 | 100 | 100 | 100 | 100 |
| | PET | 100 | 100 | 100 | 100 | 100 |
| | Water resistance test | | | | | |
| | EVA | ○ | ○ | ○ | ○ | ○ |
| | PET | ○ | ○ | ○ | ○ | ○ |
| | Different-materials adhesiveness test | | | | | |
| | PETvs EVA | 7.2 | 7.5 | 6.9 | 6.9 | 6.8 |
| | Weather resistance test | ○ | ○ | ○ | ○ | ○ |
| | Flame resistance | ○ | ○ | ○ | ○ | ○ |

TABLE 4

| Components | | Ex 13 | Ex 14 | Ex 15 | Ex 16 | Ex 17 |
|---|---|---|---|---|---|---|
| (a-1) (i) | CN975 urethane acrylate by Sartomer | | | | | |
| (a-1) (ii) | CN292 polyester acrylate by Sartomer | | | | | |
| (a-1) (iii) | CNUVE151 epoxy acrylate by Sartomer | 30 | 30 | 30 | 30 | 30 |
| (a-1) (iv) | CN963B80 urethane acrylate by Sartomer | | | | | |
| (a-2) | LIGOLAC21E-A-2 by Showa Highpolymer | | | | | |
| (b-1) (i) | N-vinyl caprolactam | 60 | 60 | 60 | 60 | 60 |
| (b-2) (i) | Dipropylene glycol diacrylate (DPGDA) | | | | | |
| (b-2) (ii) | Tripropylene glycol diacrylate (TPGDA) | | | | | |
| (c-1-2) | Polybutadiene-based polyol Poly bd R-15HT | | | | | |
| (c-1-1-1) | Aromatic castor oil-based polyol URIC AC-006 | | | | | |
| (c-1-3) | Polyisoprene-based polyol Poly ip | | | | | |
| (c-2-1) | Castor oil-based polyol URIC H-1262 | | | | | |
| (c-2-1) | Castor oil-based polyol URIC H-2151U | | | | | |
| (c-1-3) | Hydroxyl-terminated liquid polyolefin Epol | 10 | | | | |
| (c-3-1) | Maleated polyisoprene LIR-420 | | 10 | | | |
| (c-3-2) | Maleic acid-modified polybutadiene Ricon130MA8 | | | 10 | | |
| (c-3-2) | 800 S | | | | 10 | |
| (c-1-4) | Epoxy polyol EPICLON U-125-60BT | | | | | 10 |
| (c-4-1) | Polyepoxy compound ADEKA RESIN EP-4100E | | | | | |
| (c-4-2) | L-207 | | | | | |
| (d) (i) | IRGACURE 819 | 5 | 5 | 5 | 5 | 5 |
| (e) | Titanium oxide by Ishihara Sangyo CR-90 | 10 | 10 | 10 | 10 | 10 |
| (f) | Phosphorus-based flame retardant by DAIHACHI CHEMICAL INDUSTRY PX-200 | 100 | 100 | 100 | 100 | 100 |
| Evaluation results | Total (parts by mass) of components (a) to (d) | 105 | 105 | 105 | 105 | 105 |
| | Viscosity mPa·s(25° C.) | 1350 | 1350 | 1400 | 1350 | 1350 |
| | Adhesiveness test | | | | | |
| | EVA | 100 | 100 | 100 | 100 | 100 |
| | PET | 100 | 100 | 100 | 100 | 100 |
| | Water resistance test | | | | | |
| | EVA | ○ | ○ | ○ | ○ | ○ |
| | PET | ○ | ○ | ○ | ○ | ○ |

TABLE 4-continued

| Components | | Ex 13 | Ex 14 | Ex 15 | Ex 16 | Ex 17 |
|---|---|---|---|---|---|---|
| | Different-materials adhesiveness test | | | | | |
| | PETvs EVA | 6.8 | 7.3 | 7.8 | 7.2 | 7.5 |
| | Weather resistance test | ○ | ○ | ○ | ○ | ○ |
| | Flame resistance | ○ | ○ | ○ | ○ | ○ |

TABLE 5

| Components | | Ex 18 | Ex 19 | Ex 20 | Ex 21 | Ex 22 |
|---|---|---|---|---|---|---|
| (a-1) (i) | CN975 urethane acrylate by Sartomer | | | | | |
| (a-1) (ii) | CN292 polyester acrylate by Sartomer | | | | | |
| (a-1) (iii) | CNUVE151 epoxy acrylate by Sartomer | 30 | 30 | | 30 | 30 |
| (a-1) (iv) | CN963B80 urethane acrylate by Sartomer | | | | | |
| (a-2) | LIGOLAC21E-A-2 by Showa Highpolymer | | | 30 | | |
| (b-1) (i) | N-vinyl caprolactam | 60 | 60 | 60 | 60 | 40 |
| (b-2) (i) | Dipropylene glycol diacrylate (DPGDA) | | | | | |
| (b-2) (ii) | Tripropylene glycol diacrylate (TPGDA) | | | | | |
| (c-1-2) | Polybutadiene-based polyol Poly bd R-15HT | | | | | |
| (c-1-1-1) | Aromatic castor oil-based polyol URIC AC-006 | | | 10 | 10 | 30 |
| (c-1-3) | Polyisoprene-based polyol Poly ip | | | | | |
| (c-2-1) | Castor oil-based polyol URIC H-1262 | | | | | |
| (c-2-1) | Castor oil-based polyol URIC H-2151U | | | | | |
| (c-1-3) | Hydroxyl-terminated liquid polyolefin Epol | | | | | |
| (c-3-1) | Maleated polyisoprene LIR-420 | | | | | |
| (c-3-2) | Maleic acid-modified polybutadiene Ricon130MA8 800 S | | | | | |
| (c-1-4) | Epoxy polyol EPICLON U-125-60BT | | | | | |
| (c-4-1) | Polyepoxy compound ADEKA RESIN EP-4100E | 10 | | | | |
| (c-4-2) | L-207 | | 10 | | | |
| (d) (i) | IRGACURE 819 | 5 | 5 | 5 | 5 | 5 |
| (e) | Titanium oxide by Ishihara Sangyo CR-90 | 10 | 10 | 10 | 10 | 10 |
| (f) | Phosphorus-based flame retardant by DAIHACHI CHEMICAL INDUSTRY PX-200 | 100 | 100 | 100 | 0 | 0 |
| Evaluation results | Total (parts by mass) of components (a) to (d) | 105 | 105 | 105 | 105 | 105 |
| | Viscosity mPa · s(25° C.) | 1300 | 1400 | 1580 | 1450 | 1750 |
| | Adhesiveness test | | | | | |
| | EVA | 100 | 100 | 100 | 100 | 100 |
| | PET | 100 | 100 | 100 | 100 | 100 |
| | Water resistance test | | | | | |
| | EVA | ○ | ○ | ○ | ○ | ○ |
| | PET | ○ | ○ | ○ | ○ | ○ |
| | Different-materials adhesiveness test | | | | | |
| | PETvs EVA | 7.6 | 7.5 | 7.5 | 8.9 | 8.2 |
| | Weather resistance test | ○ | ○ | ○ | ○ | ○ |
| | Flame resistance | ○ | ○ | ○ | X | X |

TABLE 6

| Components | | Cmp. Ex 1 | Cmp. Ex 2 | Cmp. Ex 3 | Cmp. Ex 4 |
|---|---|---|---|---|---|
| (a-1) (i) | CN975 urethane acrylate by Sartomer | | | | |
| (a-1) (ii) | CN292 polyester acrylate by Sartomer | | | | |
| (a-1) (iii) | CNUVE151 epoxy acrylate by Sartomer | 15 | 45 | 40 | 25 |
| (a-1) (iv) | CN963B80 urethane acrylate by Sartomer | | | | |
| (a-2) | LIGOLAC21E-A-2 by Showa Highpolymer | | | | |
| (b-1) (i) | N-vinyl caprolactam | 75 | 45 | 60 | 50 |
| (b-2) (i) | Dipropylene glycol diacrylate (DPGDA) | | | | |
| (b-2) (ii) | Tripropylene glycol diacrylate (TPGDA) | | | | |
| (c-1-2) | Polybutadiene-based polyol Poly bd R-15HT | | | | |
| (c-1-1-1) | Aromatic castor oil-based polyol URIC AC-006 | 10 | 10 | | 50 |
| (c-1-3) | Polyisoprene-based polyol Poly ip | | | | |
| (c-2-1) | Castor oil-based polyol URIC H-1262 | | | | |
| (c-2-1) | Castor oil-based polyol URIC H-2151U | | | | |
| (c-1-3) | Hydroxyl-terminated liquid polyolefin Epol | | | | |
| (c-3-1) | Maleated polyisoprene LIR-420 | | | | |

TABLE 6-continued

| Components | | Cmp. Ex 1 | Cmp. Ex 2 | Cmp. Ex 3 | Cmp. Ex 4 |
|---|---|---|---|---|---|
| (c-3-2) | Maleic acid-modified polybutadiene Ricon130MA8 | | | | |
| (c-3-2) | 800 S | | | | |
| (c-1-4) | Epoxy polyol EPICLON U-125-60BT | | | | |
| (c-4-1) | Polyepoxy compound ADEKA RESIN EP-4100E | | | | |
| (c-4-2) | L-207 | | | | |
| (d) (i) | IRGACURE 819 | 5 | 5 | 5 | 5 |
| (d) (ii) | PERHEXA 25B | | | | |
| (e) | Titanium oxide by Ishihara Sangyo CR-90 | 10 | 10 | 10 | 10 |
| (f) | Phosphorus-based flame retardant by DAIHACHI CHEMICAL INDUSTRY PX-200 | 100 | 100 | 100 | 100 |
| | Total (parts by mass) of components (a) to (d) | 105 | 105 | 105 | 130 |
| Evaluation results | Viscosity mPa·s(25° C.) | 600 | 1500 | 1250 | 1550 |
| | Adhesiveness test | | | | |
| | EVA | 33 | 56 | 44 | 44 |
| | PET | 56 | 56 | 56 | 56 |
| | Water resistance test | | | | |
| | EVA | X | Δ | Δ | X |
| | PET | X | Δ | Δ | X |
| | Different-materials adhesiveness test | | | | |
| | PETvs EVA | 4.8 | 5.1 | 5.8 | 5.8 |
| | Weather resistance test | ○ | ○ | ○ | ○ |
| | Flame resistance | ○ | ○ | ○ | ○ |

TABLE 7

| Components | | Cmp. Ex 5 | Cmp. Ex 6 |
|---|---|---|---|
| (a-1) (i) | CN975 urethane acrylate by Sartomer | | |
| (a-1) (ii) | CN292 polyester acrylate by Sartomer | | |
| (a-1) (iii) | CNUVE151 epoxy acrylate by Sartomer | 30 | 30 |
| (a-1) (iv) | CN963B80 urethane acrylate by Sartomer | | |
| (a-2) | LIGOLAC21E-A-2 by Showa Highpolymer | | |
| (b-1) (i) | N-vinyl caprolactam | 60 | 60 |
| (b-2) (i) | Dipropylene glycol diacrylate (DPGDA) | | |
| (b-2) (ii) | Tripropylene glycol diacrylate (TPGDA) | | |
| (c-1-2) | Polybutadiene-based polyol Poly bd R-15HT | | |
| (c-1-1-1) | Aromatic castor oil-based polyol URIC AC-006 | 10 | 10 |
| (c-1-3) | Polyisoprene-based polyol Poly ip | | |
| (c-2-1) | Castor oil-based polyol URIC H-1262 | | |
| (c-2-1) | Castor oil-based polyol URIC H-2151U | | |
| (c-1-3) | Hydroxyl-terminated liquid polyolefin Epol | | |
| (c-3-1) | Maleated polyisoprene LIR-420 | | |
| (c-3-2) | Maleic acid-modified polybutadiene Ricon130MA8 | | |
| (c-3-2) | 800 S | | |
| (c-1-4) | Epoxy polyol EPICLON U-125-60BT | | |
| (c-4-1) | Polyepoxy compound ADEKA RESIN EP-4100E | | |
| (c-4-2) | L-207 | | |
| (d) (i) | IRGACURE 819 | 0.05 | 20 |
| (d) (ii) | PERHEXA 25B | | |
| (e) | Titanium oxide by Ishihara Sangyo CR-90 | 10 | 10 |
| (f) | Phosphorus-based flame retardant by DAIHACHI CHEMICAL INDUSTRY PX-200 | 100 | 100 |
| | Total (parts by mass) of components (a) to (d) | 100.05 | 120 |
| Evaluation results | Viscosity mPa·s(25° C.) | 1050 | 1050 |
| | Adhesiveness test | — | |
| | EVA | — | 47 |
| | PET | — | 56 |
| | Water resistance test | | |
| | EVA | — | X |
| | PET | — | X |
| | Different-materials adhesiveness test | | |
| | PETvs EVA | — | 5.6 |
| | Weather resistance test | — | X |
| | Flame resistance | — | X |

As obvious as shown in the above tables, in Examples 1 to 21 of the present invention, because the components (a), (b), (c), (d), and (e) were blended with a specific quantitative relationship therebetween, it is possible to provide a solar cell-backsheet coating composition which is good in adhesiveness to EVA and polyester-based resin, which are sealing materials of solar cells, and which is excellent in various characteristics such as water-vapor barrier properties, weather resistance, flame resistance, light reflectivity, and light diffusion properties, and which is excellent in design characteristics at low cost and have a high protection ability.

Meanwhile, in Comparative Example 1, the amount of the component (a) blended was less than the lower limit specified by the present invention. The amount of the component (b) blended was over the upper limit specified by the present invention. Therefore, the adhesiveness to the adherend deteriorated. Moreover, the different-materials adhesiveness and the water resistance deteriorated.

In Comparative Example 2, the amount of the component (a) blended was over the upper limit specified by the present invention. As a result, the viscosity increased, and the adhesiveness to the adherend deteriorated. Moreover, the different-materials adhesiveness and the water resistance deteriorated.

In Comparative Example 3, the component (c) was not blended. Therefore, the viscosity increased, and the adhesiveness to the adherend deteriorated. Moreover, the different-materials adhesiveness and the water resistance deteriorated.

In Comparative Example 4, the amount of the component (c) blended was over the upper limit specified by the present invention. Therefore, the viscosity rose, and the adhesiveness to the adherend deteriorated. Moreover, the different-materials adhesiveness and the water resistance deteriorated.

In Comparative Example 5, the amount of the component (d) blended was less than the lower limit specified by the present invention. Therefore, the components were not cured.

In Comparative Example 6, the amount of the component (d) blended was over the upper limit specified by the present invention. Therefore, the adhesiveness to the adherend deteriorated. Moreover, the different-materials adhesiveness, the water resistance, the weather resistance, and the flame resistance deteriorated.

The invention claimed is:

1. A coating composition for a solar cell backsheet, comprising:
   (a) 10 to 40 mass % of vinyl ester resin or unsaturated polyester resin;
   (b) 30 to 70 mass % of vinyl monomer and/or (meth)acrylate monomer;
   (c) 5 to 40 mass % of denaturant (the components (a) to (c) are 100 mass % in total);
   (d) 0.1 to 15 parts by mass of an ultraviolet curing agent relative to 100 parts by mass in total of the components (a) to (c); and
   (e) 5 to 20 parts by mass of a white colorant relative to 100 parts by mass in total of the components (a) to (c).

2. The coating composition for a solar cell backsheet according to claim 1, characterized in that
   the component (a) is epoxy (meth)acrylate resin.

3. The coating composition for a solar cell backsheet according to claim 1, characterized in that
   the component (b) is a monomer having an N-vinyl group.

4. The coating composition for a solar cell backsheet according to claim 1, characterized in that
   the component (c) is at least one selected from among a group consisting of: polyol (c-1) with a hydroxyl value of 40 to 330 mgKOH/g; polyol (c-2) with a hydroxyl value of 40 to 330 mgKOH/g and with an acid value of 2 to 20 mgKOH/g; modified rubber (c-3); and compound (c-4) with an epoxy equivalent of 150 to 700 g/mol.

5. The coating composition for a solar cell backsheet according to claim 4, characterized in that
   the component (c-1) is at least one selected from among a group consisting of: castor oil-based polyol (c-1-1) with a hydroxyl value of 40 to 330 mgKOH/g; polybutadiene-based polyol (c-1-2) with a hydroxyl value of 40 to 330 mgKOH/g; and polyisoprene-based polyol, or a hydrogen additive thereof, (c-1-3) with a hydroxyl value of 40 to 330 mgKOH/g.

6. The coating composition for a solar cell backsheet according to claim 5, characterized in that
   the component (c-1) is an aromatic castor oil-based polyol (c-1-1-1) with a hydroxyl value of 40 to 330 mgKOH/g.

7. The coating composition for a solar cell backsheet according to claim 4, characterized in that
   the component (c-2) is a castor oil-based polyol (c-2-1) with a hydroxyl value of 40 to 330 mgKOH/g and with an acid value of 2 to 20 mgKOH/g.

8. The coating composition for a solar cell backsheet according to claim 4, characterized in that
   the component (c-3) is acid-modified polybutadiene or acid-modified polyisoprene.

9. The coating composition for a solar cell backsheet according to claim 4, characterized in that
   the component (c-4) is a polyepoxy compound (c-4-1) with an epoxy equivalent of 150 to 250 g/mol.

10. The coating composition for a solar cell backsheet according to claim 4, characterized in that
    the component (c-4) is a polymer (c-4-2) with an epoxy equivalent of 500 to 700 g/mol that includes a saturated skeleton.

11. The coating composition for a solar cell backsheet according to claim 1, characterized in that
    an adherend is at least one selected from among copolymers of ethylene and vinyl acetate and polyester-based resins.

12. A solar cell backsheet, comprising:
    a layer (A) of the coating composition for a solar cell backsheet claimed in claim 1; and
    a layer (B) made from polyester-based resin.

13. The coating composition for a solar cell backsheet according to claim 2, characterized in that
    the component (b) is a monomer having an N-vinyl group.

14. The coating composition for a solar cell backsheet according to claim 2, characterized in that
    the component (c) is at least one selected from among a group consisting of: polyol (c-1) with a hydroxyl value of 40 to 330 mgKOH/g; polyol (c-2) with a hydroxyl value of 40 to 330 mgKOH/g and with an acid value of 2 to 20 mgKOH/g; modified rubber (c-3); and compound (c-4) with an epoxy equivalent of 150 to 700 g/mol.

15. The coating composition for a solar cell backsheet according to claim 3, characterized in that
    the component (c) is at least one selected from among a group consisting of: polyol (c-1) with a hydroxyl value of 40 to 330 mgKOH/g; polyol (c-2) with a hydroxyl value of 40 to 330 mgKOH/g and with an acid value of 2 to 20 mgKOH/g; modified rubber (c-3); and compound (c-4) with an epoxy equivalent of 150 to 700 g/mol.

16. The coating composition for a solar cell backsheet according to claim 2, characterized in that
    an adherend is at least one selected from among copolymers of ethylene and vinyl acetate and polyester-based resins.

17. The coating composition for a solar cell backsheet according to claim 3, characterized in that
  an adherend is at least one selected from among copolymers of ethylene and vinyl acetate and polyester-based resins.

18. The coating composition for a solar cell backsheet according to claim 4, characterized in that
  an adherend is at least one selected from among copolymers of ethylene and vinyl acetate and polyester-based resins.

19. A solar cell backsheet, comprising:
  a layer (A) of the coating composition for a solar cell backsheet claimed in claim 2; and
  a layer (B) made from polyester-based resin.

20. A solar cell backsheet, comprising:
  a layer (A) of the coating composition for a solar cell backsheet claimed in claim 4; and
  a layer (B) made from polyester-based resin.

* * * * *